(12) United States Patent
Oh et al.

(10) Patent No.: US 8,194,455 B2
(45) Date of Patent: Jun. 5, 2012

(54) METHODS FOR PROGRAMMING NONVOLATILE MEMORY DEVICES

(75) Inventors: Hyun-Sil Oh, Gyeonggi-do (KR); Kitae Park, Gyeonggi-do (KR); Soonwook Hwang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 309 days.

(21) Appl. No.: 12/701,037

(22) Filed: Feb. 5, 2010

(65) Prior Publication Data
US 2010/0202215 A1    Aug. 12, 2010

(30) Foreign Application Priority Data

Feb. 6, 2009  (KR) ......................... 10-2009-0009620
Apr. 23, 2009  (KR) ......................... 10-2009-0035609

(51) Int. Cl.
*G11C 16/04* (2006.01)
(52) U.S. Cl. ............................. 365/185.17; 365/185.28
(58) Field of Classification Search ............. 365/185.17, 365/185.28, 185.18
See application file for complete search history.

(56) References Cited

U.S. PATENT DOCUMENTS

| | | | |
|---|---|---|---|
| 5,677,873 A | 10/1997 | Choi et al. | |
| 5,715,194 A | 2/1998 | Hu | |
| 5,991,202 A | 11/1999 | Derhacobian et al. | |
| 6,061,270 A | 5/2000 | Choi | |
| 7,054,195 B2 | 5/2006 | Matsunaga | |
| 7,286,408 B1 | 10/2007 | Higashitani | |
| 2005/0105359 A1 | 5/2005 | Matsunaga | |
| 2008/0025098 A1 | 1/2008 | Byeon et al. | |
| 2008/0049502 A1* | 2/2008 | Byeon et al. ............ | 365/185.05 |
| 2008/0137426 A1 | 6/2008 | Dong et al. | |
| 2010/0202211 A1* | 8/2010 | Park et al. ................ | 365/185.19 |
| 2011/0044108 A1* | 2/2011 | Byeon et al. ............ | 365/185.05 |

FOREIGN PATENT DOCUMENTS

| | | |
|---|---|---|
| JP | 2005-038457 | 2/2005 |
| JP | 2005-327409 | 11/2005 |
| KR | 1020050008540 A | 1/2005 |
| KR | 1020060107697 A | 10/2006 |
| KR | 100761470 B1 | 9/2007 |
| KR | 100770754 B1 | 10/2007 |
| KR | 1020080010032 A | 1/2008 |

* cited by examiner

*Primary Examiner* — Vu Le
(74) *Attorney, Agent, or Firm* — Myers Bigel Sibley & Sajovec

(57) ABSTRACT

Provided is a method for programming a nonvolatile memory device. The nonvolatile memory device includes a local word line to divide a memory cell string into a first area including a selected word line and a second area not including the selected word line. In the method, word lines of the first area are driven by a first pass voltage and word lines of the second area driven by a second pass voltage higher than the first pass voltage. A cell transistor corresponding to the local word line is turned off after the first pass voltage and the second pass voltage are applied. The selected word line is driven by a program voltage after the cell transistor is turned off.

16 Claims, 34 Drawing Sheets

(a) t = t1

(b) t = t2

(c) t = t3

(a) t = t1

(b) t = t2

(c) t = t3

(d) t = t4

(a) t = t1

(b) t = t2

(c) t = t3

(d) t = t4

METHODS FOR PROGRAMMING NONVOLATILE MEMORY DEVICES

CLAIM OF PRIORITY

This application claims priority to Korean Patent Application Nos. 10-2009-0009620, filed Feb. 6, 2009, and 10-2009-0035609, filed Apr. 23, 2009, the contents of which are hereby incorporated herein by reference.

FIELD

The present invention relates to nonvolatile memory devices and, more particularly, to methods for programming nonvolatile memory devices.

BACKGROUND

There is a growing need for semiconductor memory devices that are electrically erasable and programmable and do not require a refresh operation for data retention. Increase in storage capacity of a semiconductor memory device is also desirable. Flash memory devices provide a large storage capacity without a refresh operation and retain data even when power supply is interrupted. Therefore, flash memory devices are widely used in electronic devices, for example, portable electronic devices, that may undergo sudden power interruption.

A flash memory device, also known as an Electrically Erasable Programmable Read Only Memory (EEPROM), includes a memory cell array including floating gate transistors. The memory cell array includes a plurality of memory blocks. A plurality of bit lines are arranged in parallel in the memory blocks. Each of the memory blocks includes a plurality of strings (or NAND strings).

Each of the strings includes a string select transistor (SST), a ground select transistor (GST), and a plurality of floating gate transistors that are connected in series between the SST and the GST. Each of the floating gate transistors shares a source-drain terminal with the adjacent floating gate transistor.

Furthermore, a plurality of word lines are arranged across each of the strings. The control gates of the floating gate transistors are connected in common to each of the word lines.

In order to program memory cells including the floating gate transistors, the memory cells are first erased to have a predetermined threshold voltage (e.g., −3V). Thereafter, a high voltage (e.g., 20V) is applied to a word line, connected to a selected memory cell, to program the selected memory cell. For an accurate program operation, the threshold voltage of the selected memory cell must be increased while the threshold voltages of the unselected memory cells must be maintained without change.

However, when a program voltage is applied to a selected word line, the program voltage is applied not only to a selected memory cell, but also to an unselected memory cell connected to the selected word line. As a result, the unselected memory cell connected to the selected word line may become programmed. This accidental programming of the unselected memory cell connected to the selected word line is called a program disturbance. In particular, the program disturbance may be more problematic in a multi-level cell to which a high program voltage is applied.

SUMMARY

Some embodiments discussed herein provide methods for programming nonvolatile memory devices, which can improve reliability by reducing the likelihood or possibly preventing a program disturbance.

Further embodiments provide methods for programming a nonvolatile memory device that includes a local word line to divide a memory cell string into a first area including a selected word line and a second area not including the selected word line, the method including: driving word lines of the first area by a first pass voltage and driving word lines of the second area by a second pass voltage higher than the first pass voltage; turning off a cell transistor corresponding to the local word line after applying the first pass voltage and the second pass voltage; and driving the selected word line by a program voltage after turning off the cell transistor.

In still further embodiments, the methods further include driving the selected word line or an unselected word line of the first area by the second pass voltage after turning off the cell transistor. A local voltage, which is higher than a ground voltage and lower than the first pass voltage, may be applied to the local word line to turn off the cell transistor. The methods may further include driving an unselected word line of the first area by a voltage lower than the first pass voltage after driving the word lines of the first area by the first pass voltage.

In some embodiments, methods for programming a nonvolatile memory device that includes a first local word line to divide a memory cell string into a first area including a selected word line and a second area not including the selected word line, include: driving word lines of the first area by a first pass voltage and driving word lines of the second area by a second pass voltage higher than the first pass voltage; driving a second local word line, which is included in the first area and adjacent to the first local word line, and the first local word line respectively by a first local voltage and a second local voltage after applying the first pass voltage and the second pass voltage; and driving the selected word line by a program voltage after applying the first local voltage and the second local voltage.

In further embodiments, the methods further include driving the selected word line or an unselected word line of the first area by the second pass voltage after applying the first local voltage and the second local voltage. A cell transistor corresponding to the first local word line may be turned off by application of the second local voltage, and the second local voltage may be higher than a ground voltage and lower than the first local voltage. The methods may further include driving an unselected word line of the first area by a voltage lower than the first pass voltage after driving the word lines of the first area by the first pass voltage.

In still further embodiments, methods for programming a nonvolatile memory device include: driving a first word line by a first local voltage and driving a second word line between the first word line and a selected word line by a second local voltage lower than the first local voltage; and driving the first word line by a third local voltage lower than the second local voltage after driving the second word line by the second local voltage.

In some embodiments, the methods may further include driving the selected word line by a program voltage after driving the first word line by the third local voltage. A cell transistor connected to the first word line may be turned off by application of the third local voltage.

In further embodiments, the methods further include driving one or more unselected word lines between the second word line and the selected word line by a pass voltage higher than the second local voltage before driving the selected word line by a program voltage. The methods may further include driving the second word line by a fourth local voltage higher than the second local voltage after driving the second word line by the second local voltage.

In still further embodiments, methods for programming a nonvolatile memory device include: driving a first word line by a first local voltage, driving a second word line between the first word line and a selected word line by a second local voltage lower than the first local voltage, driving a third word line by a third local voltage, and driving a fourth word line between the third word line and a selected word line by a fourth local voltage lower than the third local voltage; driving the first word line by a fifth local voltage lower than the second local voltage after driving the second word line by the second local voltage, and driving the third word line by a sixth local voltage lower than the fourth local voltage after driving the fourth word line by the fourth local voltage; and driving the selected word line by a program voltage after driving the first/third word line by the fifth/sixth local voltage, wherein the selected word line is disposed between the second word line and the fourth word line.

In some embodiments, a cell transistor connected to the first word line is turned off by application of the fifth local voltage, and a cell transistor connected to the third word line is turned off by application of the sixth local voltage.

In further embodiments, the methods further include, before driving the selected word line by a program voltage, driving one or more unselected word lines between the second word line and the selected word line by a pass voltage higher than the second local voltage or driving one or more unselected word lines between the fourth word line and the selected word line by the pass voltage higher than the fourth local voltage.

DETAILED DESCRIPTION

Figure 1:
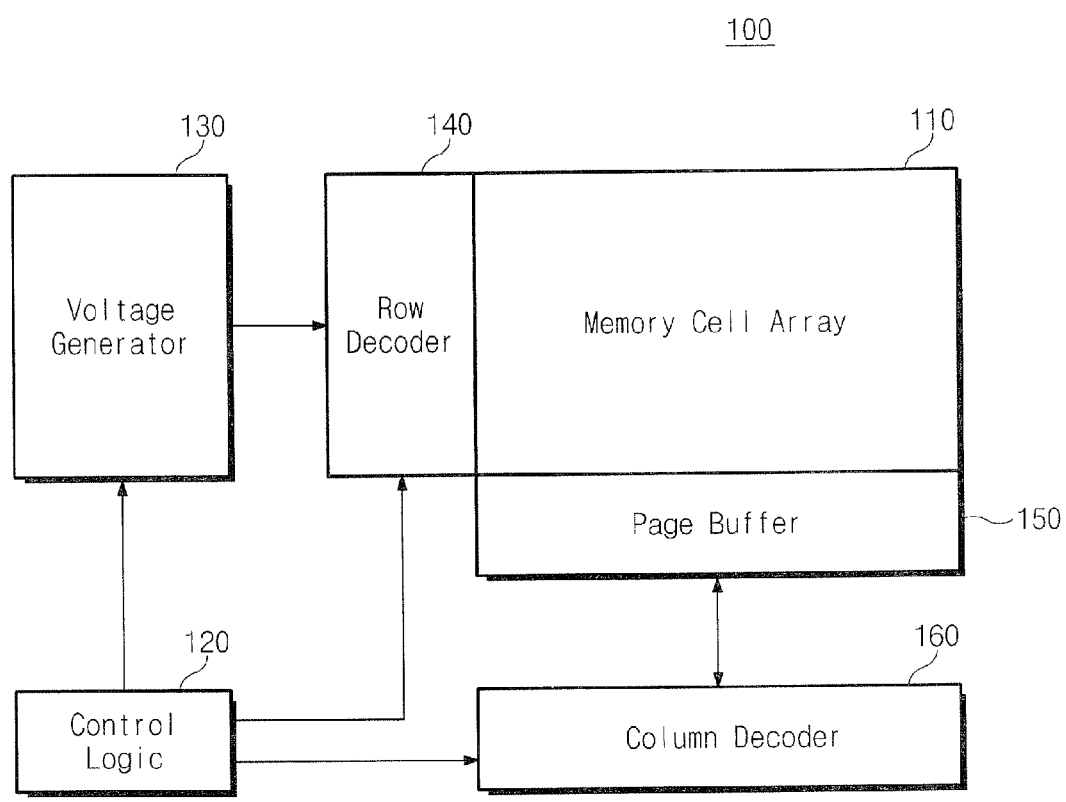
FIG. 1 is a block diagram of a nonvolatile memory device according to some embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Several techniques for reducing or possibly preventing the effect of a program disturbance have been proposed. For example, a program inhibition method based on a self-boosting scheme is disclosed in U.S. Pat. No. 5,677,873 entitled METHOD OF PROGRAMMING FLASH EEPROM INTEGRATED CIRCUIT MEMORY DEVICES TO PREVENT INADVERTENT PROGRAMMING OF NONDESIGNATED NAND MEMORY CELLS THEREIN, and in U.S. Pat. No. 5,991,202 entitled METHOD FOR REDUCING PROGRAM DISTURB DURING SELF-BOOSTING IN A NAND FLASH MEMORY, the disclosures of which are hereby incorporated herein by reference as if set forth in their entirety.

In a program inhibition method based on a self-boosting scheme, a voltage of 0V is applied to the gate of a ground select transistor to interrupt a ground path. A voltage of 0V is applied to a selected bit line, and a power supply voltage Vcc as a program inhibition voltage is applied to an unselected bit line.

At string the same time, the power supply voltage Vcc is applied to the gate of a string select transistor to charge the source of the string select transistor to a voltage of Vcc−Vth (Vth is the threshold voltage of the string select transistor), thereby turning off (or shutting off) the select transistor.

Thereafter, a program voltage Vpgm is applied to a selected word line, and a pass voltage Vpass is applied to unselected word lines, to boost the channel voltage of a program-inhibited cell transistor. This reduces the likelihood or possibly prevents F-N tunneling between a channel and a floating gate, so that the program-inhibited cell transistor maintains the initial erase state.

A program inhibition method based on a local self-boosting scheme is disclosed in U.S. Pat. No. 5,715,194 entitled BIAS SCHEME OF PROGRAM INHIBIT FOR RANDOM PROGRAMMING IN A NAND FLASH MEMORY, and in U.S. Pat. No. 6,061,270 entitled METHOD FOR PROGRAMMING A NON-VOLATILE MEMORY DEVICE WITH PROGRAM DISTURB CONTROL, the disclosures of which are hereby incorporated herein by reference as if set forth in their entirety.

In a program inhibition method based on a local self-boosting scheme, a voltage of 0V is applied to two unselected word lines adjacent to a selected word line. Furthermore, after a pass voltage Vpass (e.g., 10V) is applied to other unselected word lines, a program voltage Vpgm is applied to the selected word line.

Under such bias conditions, the channel of a self-boosted cell transistor is restricted to the selected word line, and the channel boosting voltage of a program-inhibited cell transistor is increased in comparison with a program inhibition method based on a self-boosting scheme. Therefore, F-N tunneling may not occur between the channel and the floating gate of the program-inhibited cell transistor, so that the program-inhibited cell transistor maintains the initial erase state.

Referring to FIG. 1, a block diagram of a nonvolatile memory device according to some embodiments will be discussed. As illustrated in FIG. 1, a nonvolatile memory device 100 according to some embodiments includes a memory cell array 110, a control logic circuit 120, a voltage generator 130, a row decoder 140, a page buffer 150, and a column decoder 160.

Although not illustrated in FIG. 1, the memory cell array 110 includes memory cells that are arranged in a matrix configuration of rows (or word lines) and columns (or bit lines). The memory cells may be arranged to have a NAND or NOR structure. In the NAND structure, each memory cell string includes transistors that are connected in series.

The control logic circuit 120 is configured to control an overall operation of the nonvolatile memory device 100. In an exemplary embodiment, the control logic circuit 120 controls a series of program-related operations. For example, the control logic circuit 120 may be a state machine storing a program sequence. However, it will be apparent to those skilled in the art that the control logic circuit 120 is not limited to the contents disclosed herein. For example, the control logic circuit 120 may be configured to control an erase operation and a read operation.

Under the control of the control logic circuit 120, the voltage generator 130 generates voltages to be applied to a selected word line, an unselected word line, a string select line SSL, a ground select line GSL, and a common source line CSL. Also, the voltage generator 130 may generate a program voltage Vpgm, a pass voltage Vpass, a read voltage Vread, and a verify read voltage Vvfy.

Under the control of the control logic circuit 120, the row decoder 140 drives a selected word line, unselected word lines, a string select line SSL, a ground select line GSL, and a common source line CSL in response to a row address.

The row decoder 140 drives the above lines by using the voltages generated by the voltage generator 130. For example, in a program operation, the row decoder 140 applies a program voltage Vpgm and a pass voltage Vpass respectively to a selected word line and an unselected word line.

The page buffer 150 operates as a sense amplifier or a write driver. In a read operation, the page buffer 150 reads data from the memory cell array 110. Specifically, the page buffer 150 senses a bit line voltage, discriminates data according to the level of the bit line voltage, and stores the discriminated data therein.

In a program operation, the page buffer 150 drives bit lines at a power supply voltage Vcc or a ground voltage 0V according to data received through the column decoder 160. For example, a ground voltage is applied to a bit line connected to a memory cell to be programmed, and a power supply voltage is applied to a bit line connected to a memory cell not to be programmed. The principle of the page buffer 150 operating as a sense amplifier or a write driver is well known to those skilled in the art, and thus its description will be omitted for conciseness.

In response to a column address, the column decoder 160 reads data latched in the page buffer 150 or transfers data to the page buffer 150. For example, in a program operation, the column decoder 160 receives data from an external device (e.g., a host) and latches the received data in the page buffer 150.

Figure 2:
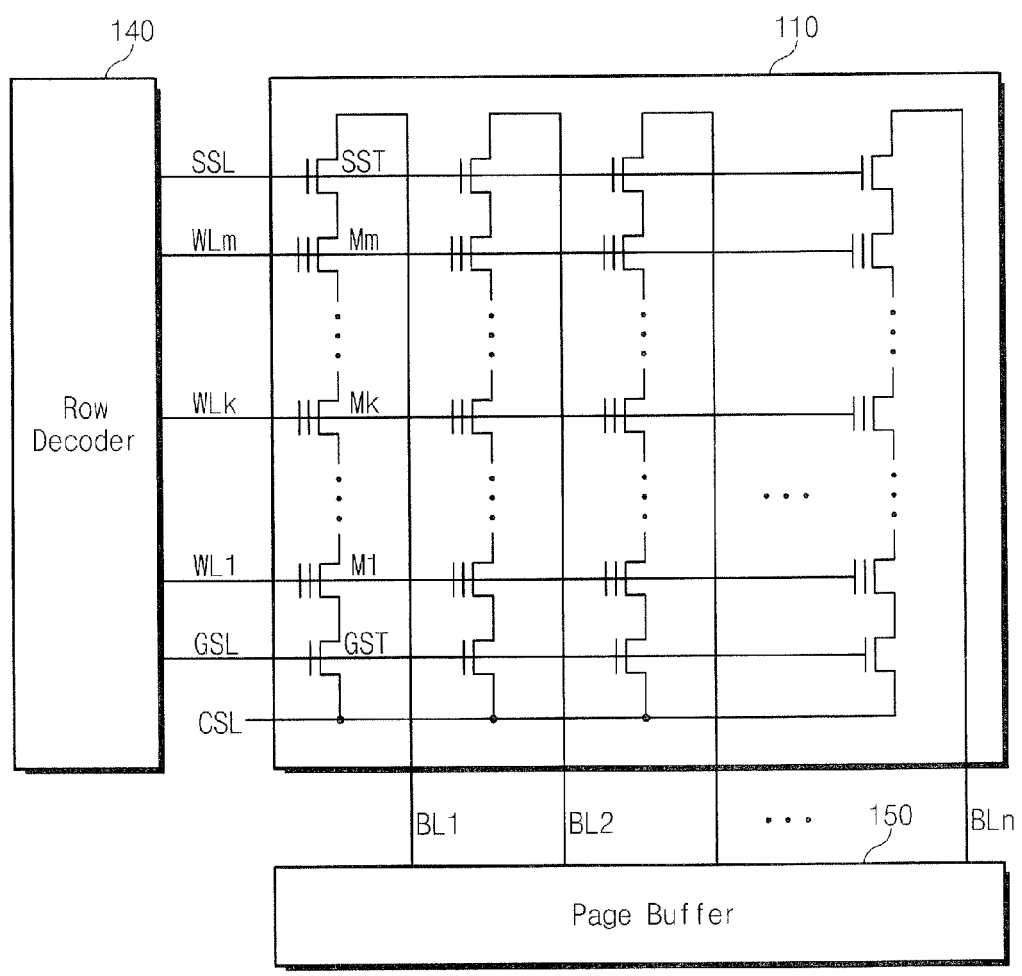
FIG. 2 is a diagram illustrating a detailed structure of a memory cell array illustrated in FIG. 1.

Referring to FIG. 2, a diagram illustrating a detailed structure of the memory cell array 110 illustrated in FIG. 1 will be discussed. As illustrated in FIG. 2, the memory cell array 110 includes a plurality of word lines WL1~WLm, a plurality of bit lines BL1~BLn, and a plurality of memory cells M1~Mm. The word lines WL1~WLm of the memory cell array 110 are connected to the row decoder 140.

The row decoder 140 is connected to a string select line SSL, the word lines WL1~WLm, and a ground select line GSL. The row decoder 140 selects one or more of the word lines in response to a row address (not illustrated).

The bit lines BL1~BLn of the memory cell array 110 are connected to the page buffer 150. The page buffer 150 drives the bit lines BL1~BLn. According to an exemplary embodiment, in a program operation, the page buffer 150 applies a ground voltage 0V and a program inhibition voltage Vcc respectively to a selected bit line and an unselected bit line.

Figure 3:
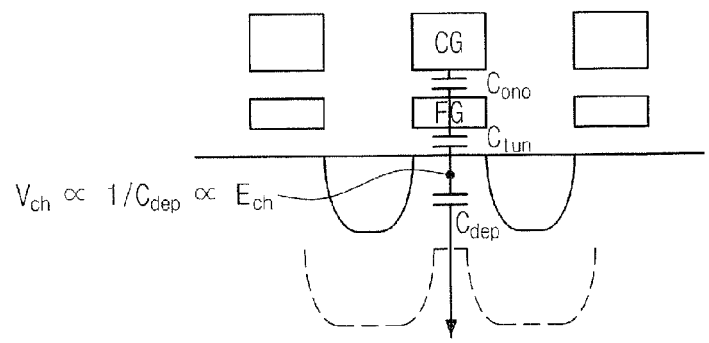
FIG. 3 is a diagram illustrating the capacitances in a memory cell.

Referring now to FIG. 3, a diagram illustrating the capacitances in the memory cell will be discussed. As illustrated in FIG. 3, a tunnel oxide capacitance $C_{tan}$ is present between a channel and a floating gate FG. An ONO (Oxide Nitride Oxide) capacitance $C_{ono}$ is present between the floating gate FG and a control gate CG. A depletion capacitance $C_{dep}$ is present between the channel and a bulk substrate (Si-Sub).

As a voltage is applied to the control gate CG, a channel voltage $V_{ch}$ increases by the capacitances $C_{ono}$, $C_{ox}$ and $C_{dep}$.

In the result, the memory cell connected to an unselected bit line is not programmed. The channel voltage $V_{ch}$ must increase up to a sufficient level for program inhibition.

However, as illustrated in FIG. 3, the channel voltage $V_{ch}$ is inversely proportional to the depletion capacitance $C_{dep}$. That is, under a constant voltage, the channel voltage $V_{ch}$ increases with a decrease in the depletion capacitance $C_{dep}$. This can be described by Electric Charge Conservation Law (Q=CV, Q: Charge Quantity; C: Capacitance; and V: Voltage). In the result, the depletion capacitance $C_{dep}$ need be decreased in order to increase the channel voltage $V_{ch}$ up to a sufficient level.

However, the depletion capacitance $C_{dep}$ is inversely proportional to a channel electron density $E_{ch}$. That is, the depletion capacitance $C_{dep}$ increases with a decrease in the channel electron density $E_{ch}$. In the result, the channel voltage $V_{ch}$ can be increased by decreasing the channel electron density $E_{ch}$.

In the inventive concept, the channel voltage $V_{ch}$ can be increased by decreasing the channel electron density $E_{ch}$ of an unselected string. The channel electron density can be decreased by the transfer of electrons. As the channel voltage $V_{ch}$ is increased, a program disturbance caused by a program voltage can be prevented. In particular, the program disturbance may be more problematic in a multi-level cell to which a high program voltage is applied. In the result, a program method according to some embodiments can have a great effect in a multi-level cell.

Figure 4:
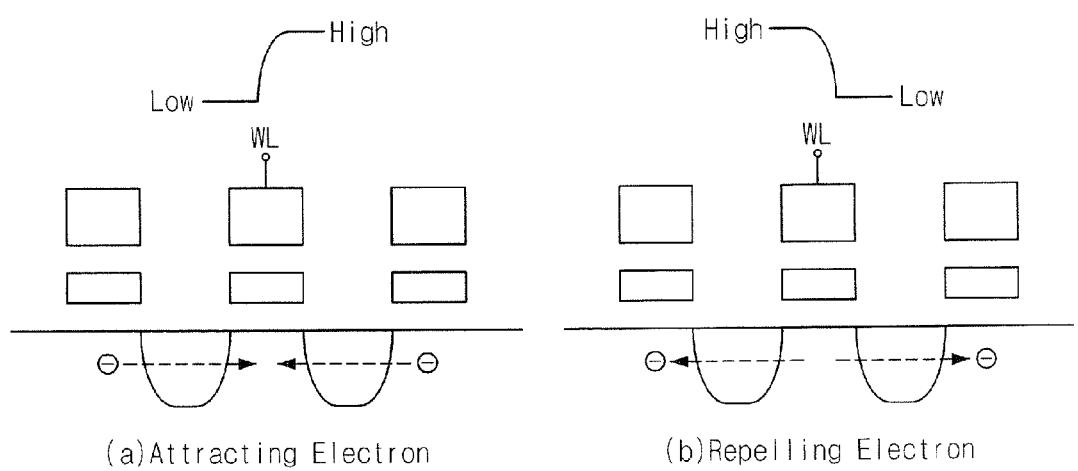
FIG. 4 is a diagram illustrating an electron transferring method according to some embodiments.

Referring now to FIG. 4, a diagram illustrating an electron transferring method according to some embodiments will be discussed. In some embodiments, electrons transfer due to a voltage difference. Electrons transfer from a low-voltage point to a high-voltage point.

Referring to FIG. 4(a), as a voltage applied to a word line WL transitions from low to high levels, electrons transfer toward the word line WL. As the electrons transfer toward the word line WL, the electron density of a channel corresponding for the word line WL increases.

Referring to FIG. 4(b), as a voltage applied to a word line WL transitions from high to low levels, electrons recede from the word line WL. As the electrons recede from the word line WL, the electron density of a channel corresponding to the word line WL decreases. As described above, the electron transfer can be controlled by controlling the voltage applied to the word line WL.

Figure 5:
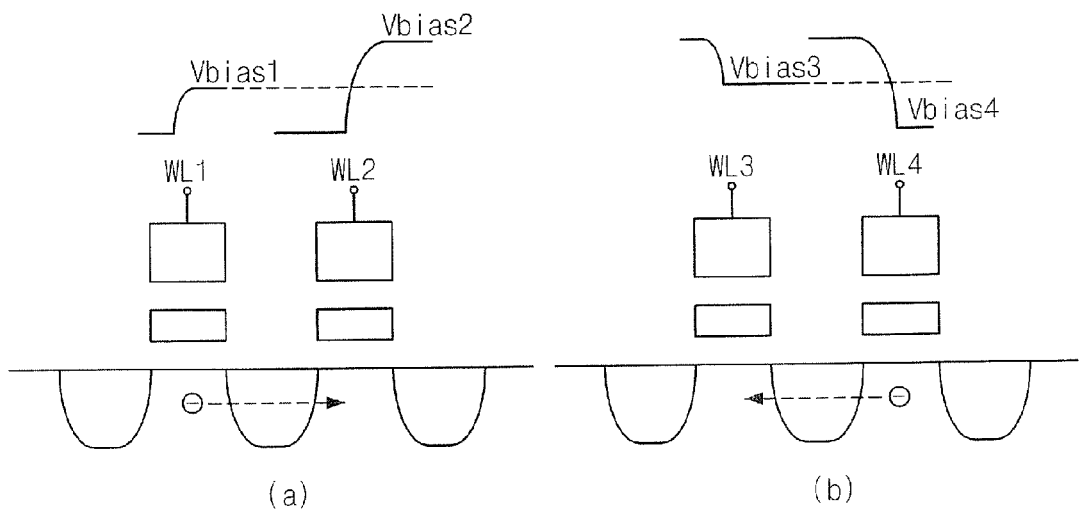
FIG. 5 is a diagram illustrating an electron transferring method according to some embodiments.

Referring now to FIG. 5, a diagram illustrating an electron transferring method according to some embodiments will be discussed. In some embodiments, electrons transfer due to a voltage difference. Electrons transfer from a low-voltage point to a high-voltage point.

Referring to FIG. 5(a), first and second bias voltages Vbias1 and Vvias2 of different levels are applied to first and second word lines WL1 and WL2 with the same voltage level. For example, the second bias voltage Vbias2 has a higher level than the first bias voltage Vbias1. In the result, electrons transfer toward the second word line WL2 to which the second bias voltage Vbias2 is applied. As the electrons transfer toward the second word line WL2, the electron density of a channel corresponding to the first word line WL1 decreases.

Referring to FIG. 5(b), third and fourth bias voltages Vbias3 and Vvias4 of different levels are applied to third and fourth word lines WL3 and WL4 with the same voltage level. For example, the third bias voltage Vbias3 has a higher level than the fourth bias voltage Vbias4. In the result, electrons transfer toward the third word line WL3 to which the third bias voltage Vbias3 is applied. As the electrons transfer toward the third word line WL3, the electron density of a channel corresponding to the fourth word line WL4 decreases.

As described above, the electrons in the channel can be transferred by applying different bias voltages to the word lines. The electron transfer changes the electron density. The boosting efficiency of the channel with a low electron density can be improved.

Figure 6:
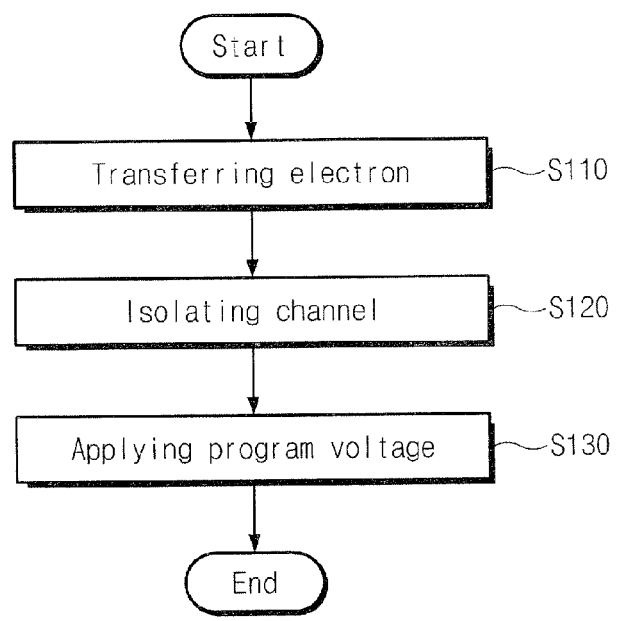
FIG. 6 is a flow chart illustrating an electron transferring method in a program operation according to some embodiments.

Referring now to FIG. 6, a flow chart illustrating an electron transferring method in a program operation according to some embodiments will be discussed. As illustrated in FIG. 6, in step S110, electrons in a channel transfer according to bias conditions. As described with reference to FIGS. 4 and 5, electrons transfer from a selected word line to a source due to a voltage difference. The channel electron density is changed by the electron transfer.

In step 120, the channel is isolated. For example, the channel may be isolated by a transistor connected to a local word line. As the channel is isolated, the channel including the selected word line has a low electron density. In step 130, a program voltage is applied to the selected word line. A channel voltage corresponding to the selected word line increases sufficiently due to the low electron density. In the result, a program operation is inhibited by the channel voltage increase.

As described above, the boosting efficiency is improved by decreasing the electron density of the channel including the selected word line. As the boosting efficiency is improved, a program disturbance is prevented.

Hereinafter, exemplary embodiments of a program method according to some embodiments will be described with reference to the accompanying drawings. However, the inventive concept is not limited to the exemplary embodiments. The main feature of the inventive concept is to increase the boosting efficiency by decreasing the channel electron density. In particular, the program disturbance may be more problematic in a multi-level cell to which a high program voltage is applied. A plurality of data may be stored in one multi-level cell. In the result, the program method according to some embodiments can have a great effect in a multi-level cell.

Figure 7:
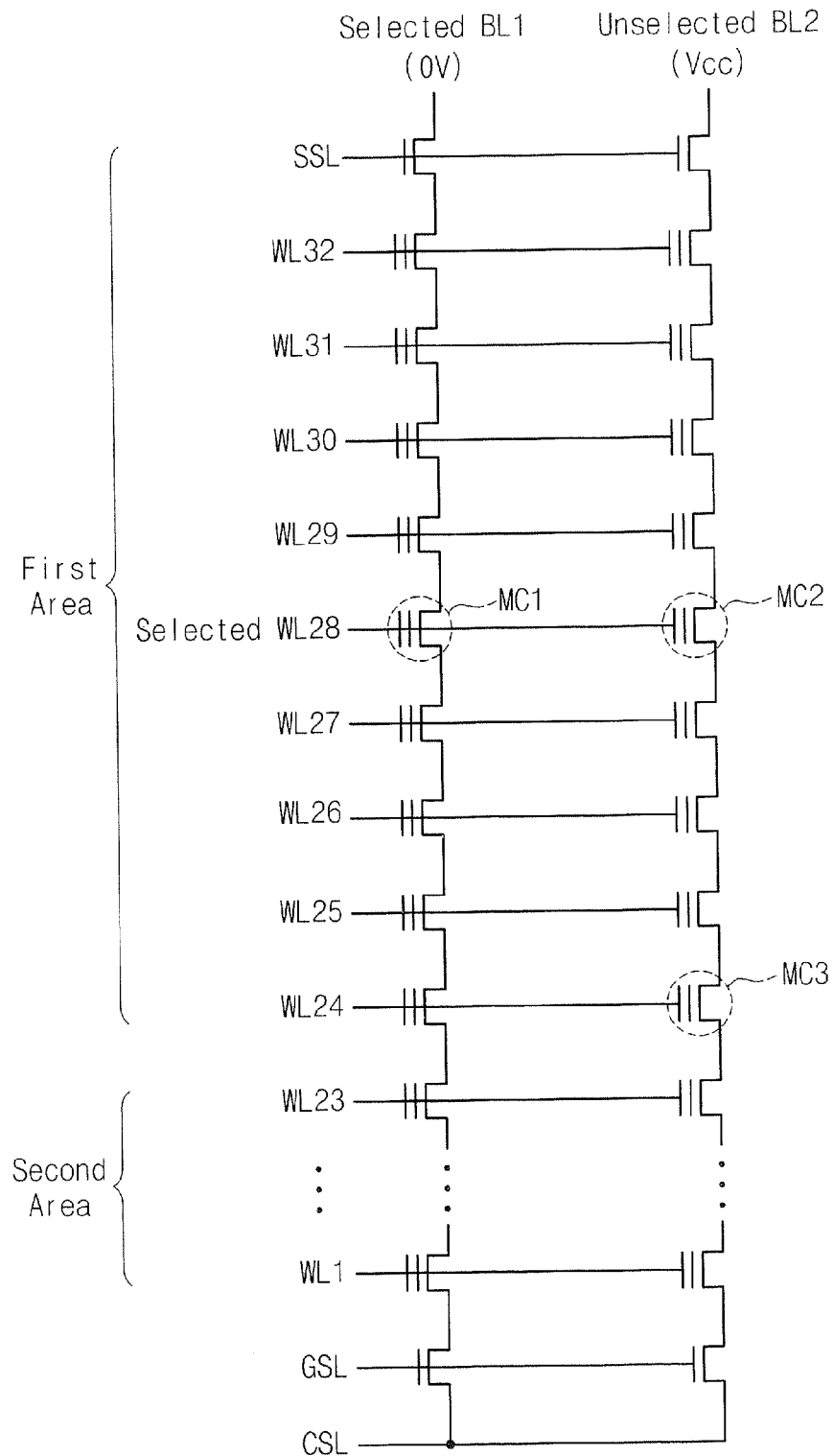
FIG. 7 is a diagram illustrating methods for programming a nonvolatile memory device according to some embodiments.

Referring now to FIG. 7, a diagram illustrating a method for programming a nonvolatile memory device according to some embodiments will be discussed. As illustrated in FIG. 7, it is assumed that a memory cell MC1 is programmed and a memory cell MC2 is not programmed. The memory cell MC1 is connected to a selected word line WL28 and a selected bit line BL1. The memory cell MC2 is connected to the selected word line WL28 and an unselected bit line BL2.

When the memory cell MC1 is programmed, the memory cell MC2 must not be programmed. In order not to program the memory cell MC2, a program inhibition voltage Vcc is applied to the unselected bit line BL2.

A local self-boosting scheme is applied in some embodiments. In a program inhibition method according to some embodiments, a ground voltage 0V is applied to an unselected word line WL24 to turn off a transistor connected to the unselected word line WL24. As the transistor is turned off, a channel is isolated.

In the result, the channel is isolated into a first area and a second area. As illustrated in FIG. 7, the selected word line WL28 is included in the first area. In this embodiment, the unselected word line WL24 isolating the channel may be called a local word line.

In some embodiments, pass voltages of different levels are applied to the first area and the second area. For example, a first pass voltage is applied to the first area, and a second pass voltage higher than the first pass voltage is applied to the second area. For example, the second pass voltage is about 9V, and the first pass voltage is about 6V.

Because the pass voltage applied to the second area is relatively high, electrons in the first area transfer to the second area. The electron density of the first area is decreased by the electron transfer. In the result, the boosting efficiency of a channel voltage is improved by the low electron density.

As the boosting efficiency of the channel voltage is improved, a program disturbance is prevented. Also, because the pass voltage applied to the first area is relatively low, the degradation of a transistor insulating layer by the pass voltage is minimized.

However, the inventive concept is not limited to the above bias conditions. For example, no or some word lines may be disposed between the selected word line WL28 and the unselected word line WL24. Also in this case, the boosting efficiency can be improved by the channel isolation.

Although 32 word lines WL1~WL32 are illustrated in this embodiment, it will be apparent to those skilled in the art that the inventive concept is not limited thereto. For example, 64 or 128 word lines may be applied in some embodiments.

Figure 8:
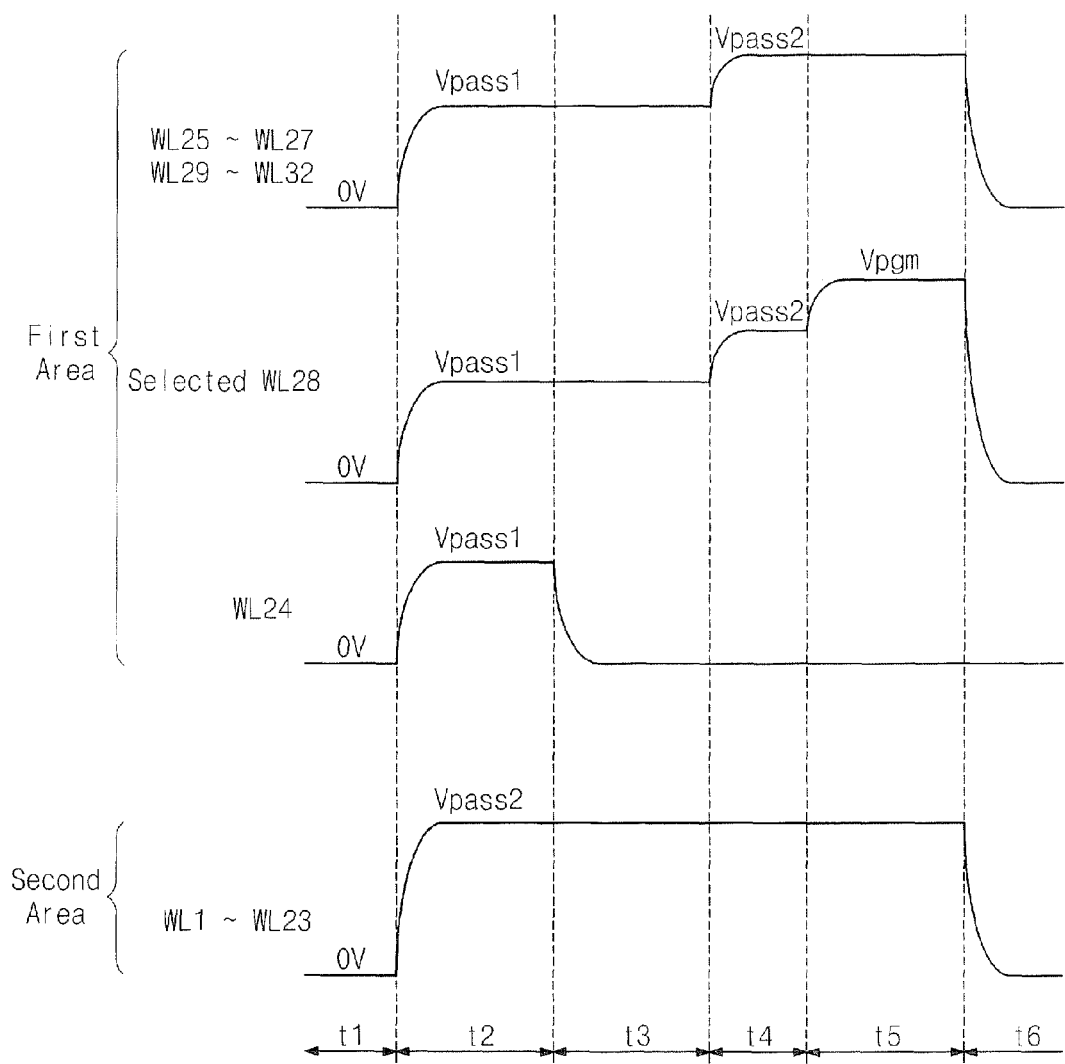
FIG. 8 is a timing diagram illustrating a bias condition in a program method according to some embodiments.

Referring now to FIG. 8, a timing diagram illustrating a bias condition in a program method according to some embodiments will be discussed. As illustrated in FIG. 8, a program method according to some embodiments includes steps t1 to t6. In step t1, a ground voltage 0V is applied to word lines for initialization.

In step t2, word lines WL24~WL32 of a first area are driven by a first pass voltage Vpass1. The first pass voltage Vpass1 is applied to turn on transistors of the first area. Also, word lines WL1~WL23 of a second area are driven by a second pass voltage Vpass2. The second pass voltage Vpass2 is applied to turn on transistors of the second area. As the word lines of the first area and the word lines of the second area are driven respectively by the first pass voltage Vpass1 and the second pass voltage Vpass2, electrons in a channel transfer. This will be described later in detail with reference to FIG. 9. Also, as the first area is driven by the first pass voltage Vpass1 lower than the second pass voltage Vpass2, the degradation of a transistor insulating layer in the first area is decreased.

In step t3, a ground voltage 0V is applied to the word line WL24 to turn off a transistor connected to the word line WL24. As the transistor is turned off, a channel is isolated. However, the inventive concept is not limited thereto. For example, the voltage applied to the word line WL24 may be not only the ground voltage 0V but also a suitable voltage for turning off the transistor.

In step t4, the selected word line WL28 and the unselected word lines WL25~WL27 and WL29~WL32 of the first area are driven by the second pass voltage Vpass2. By application of the second pass voltage Vpass2, the channel voltage of the first area increases.

In step t5, the selected word line WL28 is driven by a program voltage Vpgm. By application of the program voltage Vpgm, the channel voltage of the first area increases. Due to the increased channel voltage, an unselected memory cell MC2 is not programmed. In step t6, the respective word lines are driven by the ground voltage V0 for recovery.

However, some embodiments is not limited to the above bias conditions. The feature of the inventive concept is to transfer the electrons in the channel by varying the levels of the pass voltages applied to the first area and the second area. Thus, the bias conditions for other operations may vary according to circumstances.

Figure 9:
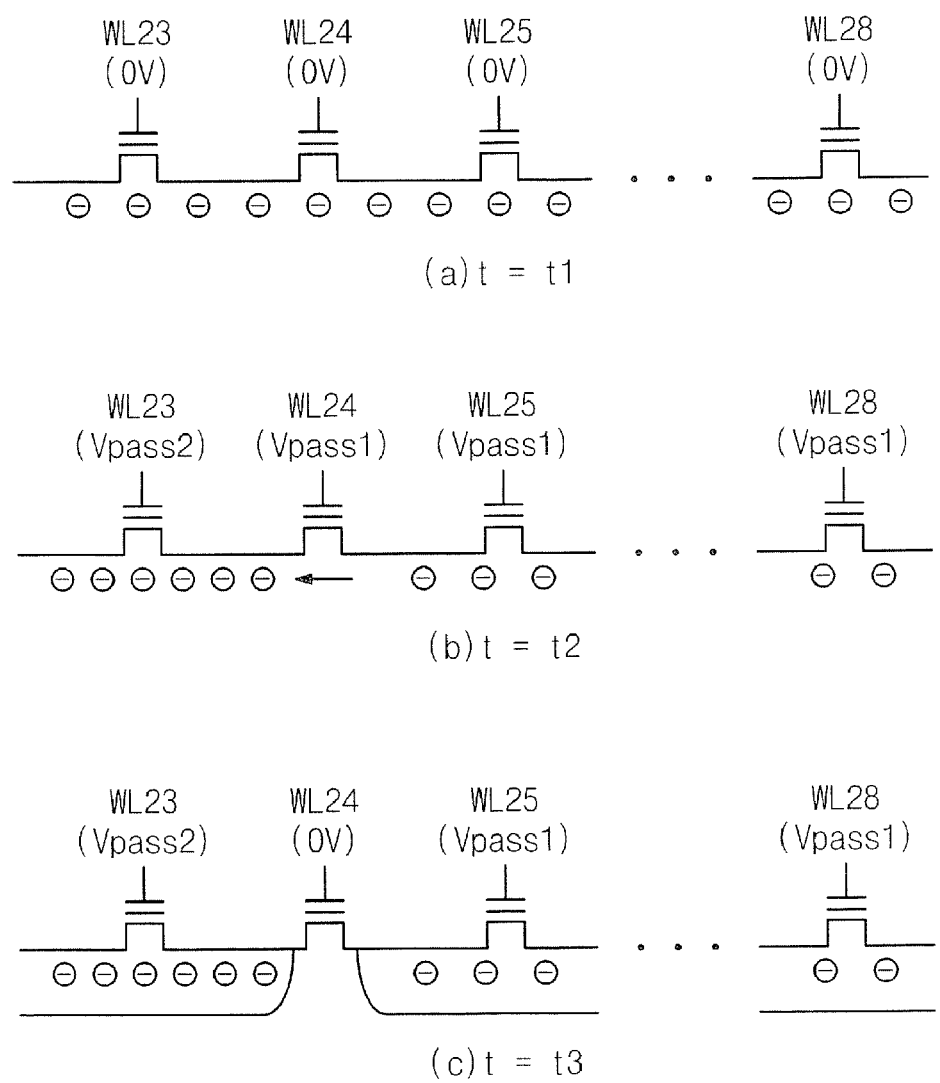
FIG. 9 is a diagram illustrating the electron distribution in a channel in periods t1 to t3 of FIG. 8.

Referring now to FIG. 9, a diagram illustrating the electron distribution in a channel in the periods t1 to t3 of FIG. 8 will be discussed. As illustrated in FIG. 9(a), the electron distribution in the channel in the period t1 of FIG. 8 (t=t1). Referring to FIG. 9(a), when the ground voltage 0V is applied to the word lines WL1~WL32, the electrons of the channel are distributed in a uniform density. For simplicity of description, only four word lines WL23, WL24, WL25 and WL28 are illustrated in FIG. 9.

FIG. 9(b) illustrates the electron distribution in the channel in the period t2 of FIG. 8 (t=t2). Referring to FIG. 9(b), the relatively-high second pass voltage Vpass2 is applied to the word line WL23, and the relatively-low first pass voltage Vpass1 is applied to the word lines WL24~WL32. Accordingly, the electrons transfer to the word line WL23.

Thus, the channel electron density of the first area decreases, and the channel electron density of the second area increases. The first area with a low electron density has an improved boosting efficiency. In the result, a program disturbance can be prevented. Also, because the relatively-low first pass voltage Vpass1 is applied to the word lines WL24~WL32 of the first area, the degradation of a transistor insulating layer can be decreased.

FIG. 9(c) illustrates the electron distribution in the channel in the period t3 of FIG. 8 (t=t3). Referring to FIG. 9(c), the ground voltage 0V is applied to the word line WL24 to turn off a transistor connected to the word line WL24. As the transistor is turned off, the channel is isolated. In the result, the channel electron density of the first area decreases. When the channel electron density decreases, the boosting efficiency of a channel voltage increases. That is, in the inventive concept, the self-boosting efficiency can be improved by decreasing the electron density of the channel corresponding to the selected word line.

Figure 10:
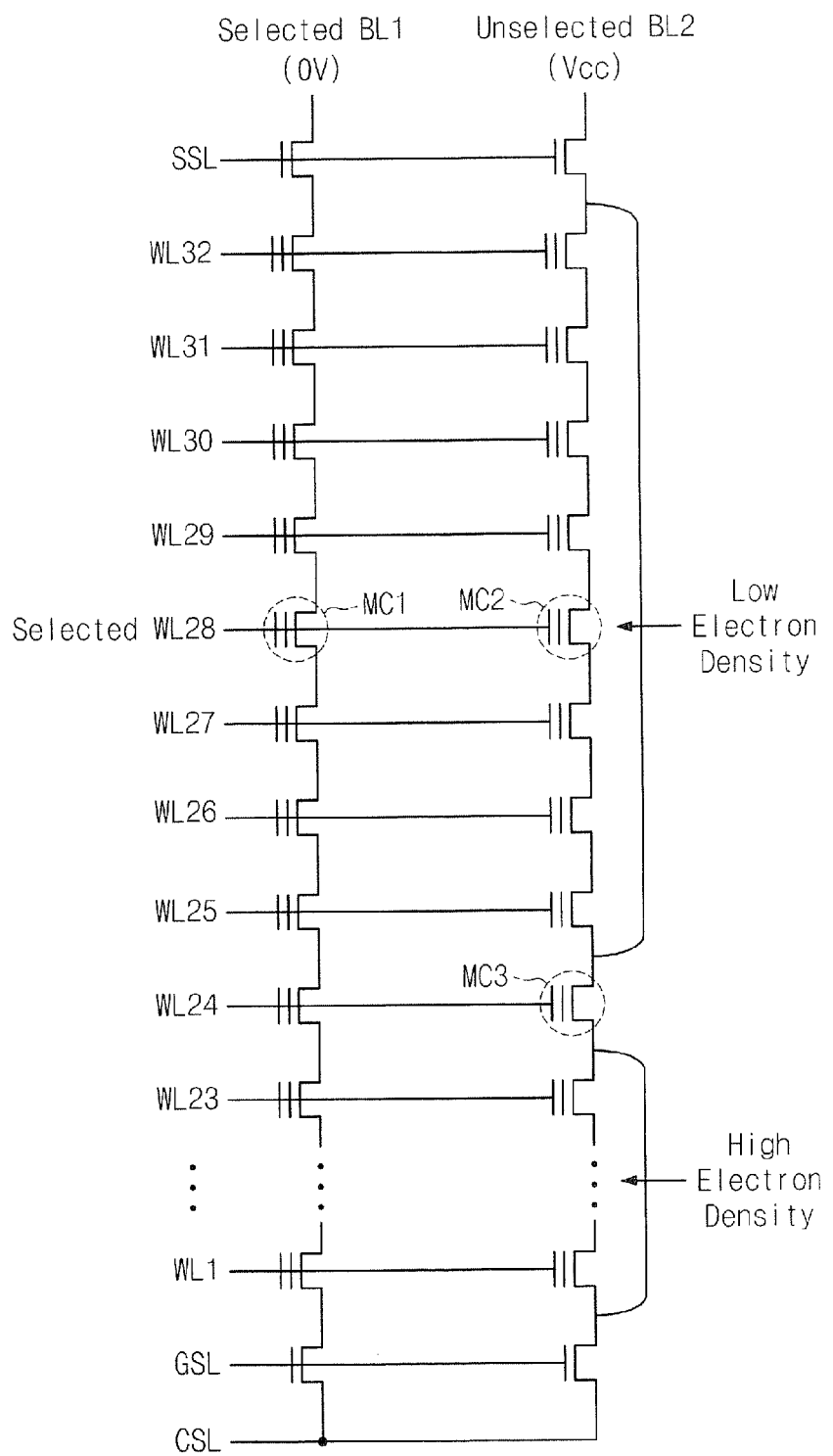
FIG. 10 is a diagram illustrating the channel isolation in a program method according to some embodiments.

Referring now to FIG. 10, a diagram illustrating the channel isolation in a program method according to some embodiments will be discussed. As illustrated in FIG. 10, as a transistor MC3 is turned off, a channel is isolated. Due to the electron transfer described with reference to FIG. 9, a channel corresponding to a selected word line has a low electron density while a channel not corresponding to the selected word line has a high electron density. Because the channel corresponding to the selected word line has a low electron density, the boosting efficiency of a channel voltage is improved. In the result, a program disturbance can be prevented by the boosting of the channel voltage.

Figure 11:
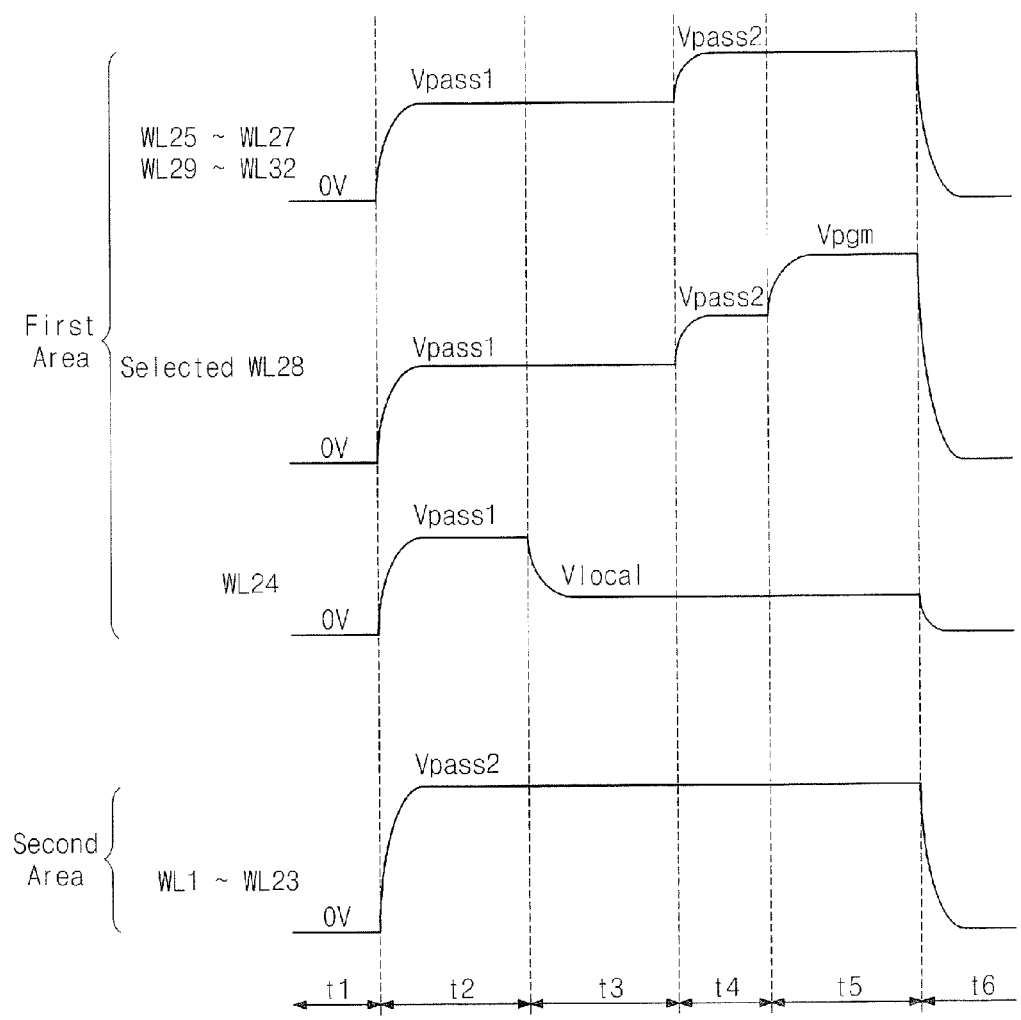
FIG. 11 is a timing diagram illustrating methods for programming a nonvolatile memory device according to some embodiments.

Referring now to FIG. 11, a timing diagram illustrating a method for programming a nonvolatile memory device according to some embodiments will be discussed. As illustrated in FIG. 11, a program method according to some embodiments includes steps t1 to t6. In step t1, a ground voltage 0V is applied to word lines for initialization.

In step t2, word lines of a first area are driven by a first pass voltage Vpass1. The first pass voltage Vpass1 is applied to turn on transistors of the first area. Also, word lines of a second area are driven by a second pass voltage Vpass2. The second pass voltage Vpass2 is applied to turn on transistors of the second area.

As the word lines of the first area and the word lines of the second area are driven respectively by the first pass voltage Vpass1 and the second pass voltage Vpass2, electrons in a channel transfer. This will be described later in detail with reference to FIG. 12. Also, as the first area is driven by the first pass voltage Vpass1 lower than the second pass voltage Vpass2, the degradation of a transistor insulating layer in the first area is decreased.

In step t3, a local voltage Vlocal is applied to the word line WL24. The local voltage Vlocal may be higher than the ground voltage V0 and lower than the first pass voltage Vpass1. The level of the local voltage Vlocal is set to turn off a transistor connected to the word line WL24. By application of the local voltage Vlocal, the transistor connected to the word line WL24 is turned off. Accordingly, the channel is isolated.

Also, the first pass voltage Vpass1 is applied to the unselected word lines WL25, WL26 and WL27 and the local voltage Vlocal is applied to the unselected word line WL24, thereby preventing a sudden change in the channel voltage. That is, the selected word line WL28 and the unselected word line WL24 are spaced, thereby preventing the problem caused by the sudden boosting of the channel voltage.

For example, if the channel voltage increases suddenly, the problem of BTBT (Band To Band Tunneling) may occur in a transistor MC3 isolating the channel. The BTBT must be avoided because it programs an unselected transistor.

The inventive concept is not limited to the above bias conditions. For example, no or some word lines may be disposed between the selected word line WL28 and the unselected word line WL24. Also in this case, the boosting efficiency can be improved by the channel isolation.

In step t4, the selected word line WL28 and the unselected word lines WL25~WL27 and WL29~WL32 of the first area are driven by the second pass voltage Vpass2. By application of the second pass voltage Vpass2, the channel voltage of the first area increases.

In step t5, the selected word line WL28 is driven by a program voltage Vpgm. By application of the program voltage Vpgm, the channel voltage of the first area increases. Due to the increased channel voltage, an unselected memory cell MC2 is not programmed. In step t6, the respective word lines are driven by the ground voltage V0 for recovery.

Figure 12:
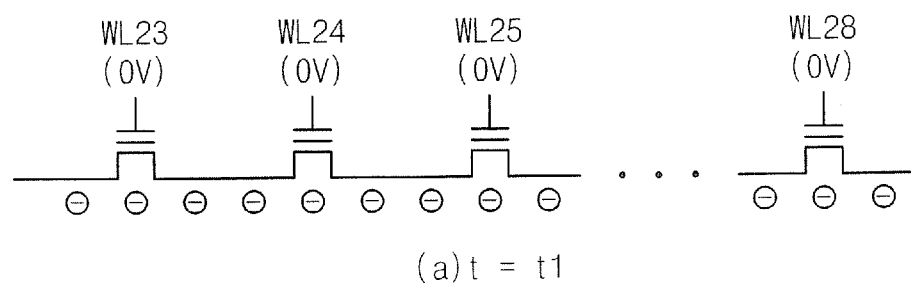
FIG. 12 is a diagram illustrating the electron distribution in a channel in periods t1 to t3 of FIG. 11.
Figure 12:
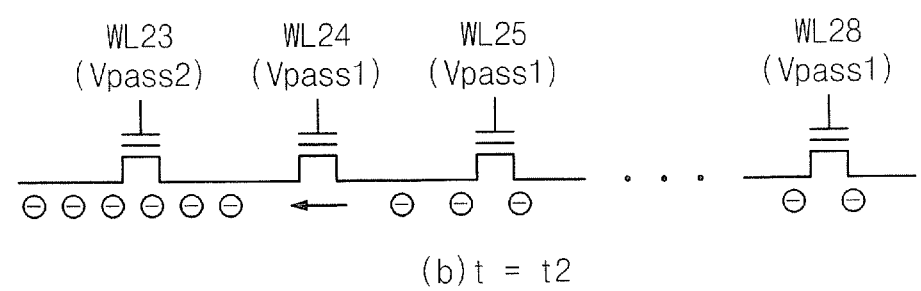
Figure 12:
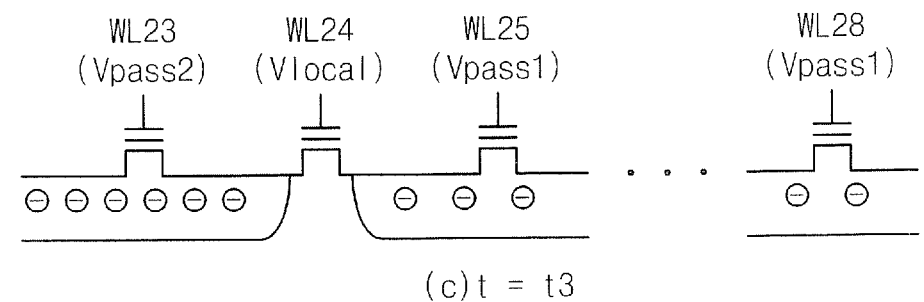

Referring now to FIG. 12, a diagram illustrating the electron distribution in a channel in the periods t1 to t3 of FIG. 11 will be discussed. FIG. 12(a) illustrates the electron distribution in the channel in the period t1 of FIG. 11 (t=t1). Referring to FIG. 12(a), when the ground voltage 0V is applied to the word lines WL1~WL32, the electrons of the channel are distributed in a uniform density.

FIG. 12(b) illustrates the electron distribution in the channel in the period t2 of FIG. 11 (t=t2). Referring to FIG. 12(b), the relatively-high second pass voltage Vpass2 is applied to the word lines WL1~WL23, and the relatively-low first pass voltage Vpass1 is applied to the word lines WL24~WL32. Accordingly, the electrons transfer to the word line WL23.

Thus, the channel of the first area has a low electron density, and the channel of the second area has a high electron density. The first area with a low electron density has an improved boosting efficiency. In the result, a program disturbance can be prevented. Also, because the relatively-low first pass voltage Vpass1 is applied to the word line of the first area, the degradation of a transistor insulating layer can be decreased.

FIG. 12(c) illustrates the electron distribution in the channel in the period t3 of FIG. 11 (t=t3). Referring to FIG. 12(c), the local voltage Vlocal is applied to the word line WL24 to turn off a transistor connected to the word line WL24. As the transistor is turned off, the channel is isolated. In the result, the channel electron density of the first area decreases. When the channel electron density decreases, the boosting efficiency of a channel voltage increases. In the inventive concept, the self-boosting efficiency can be improved by decreasing the electron density of the channel corresponding to the selected word line.

Figure 13:
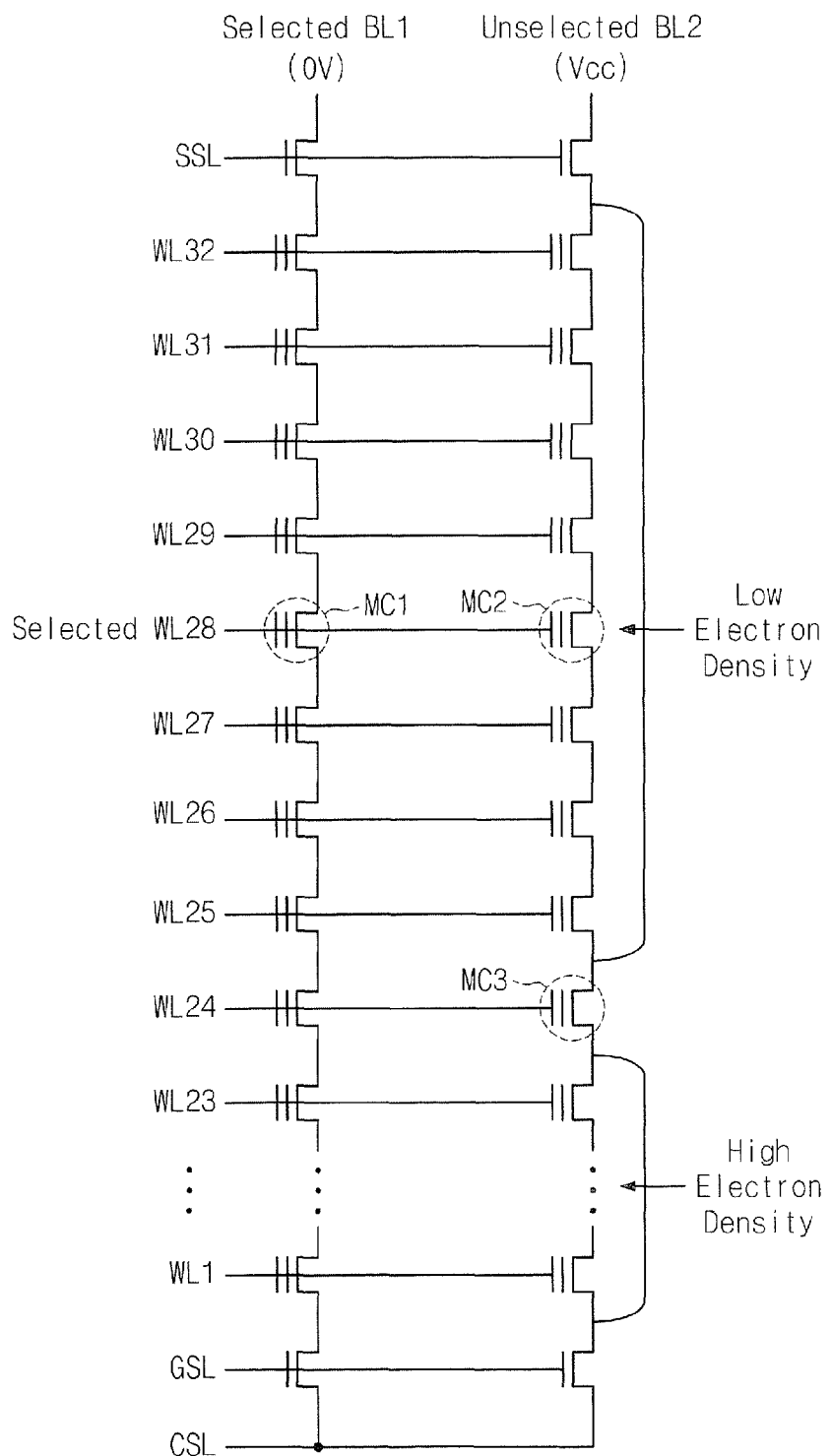
FIG. 13 is a diagram illustrating the channel isolation in a program method according to some embodiments.

Referring now to FIG. 13, a diagram illustrating the channel isolation in a program method according to some embodiments will be discussed. As illustrated in FIG. 13, as a transistor MC3 is turned off, a channel is isolated. Due to the electron transfer described with reference to FIG. 12, a channel corresponding to a selected word line has a low electron density while a channel not corresponding to the selected word line has a high electron density. Because the channel corresponding to the selected word line has a low electron density, the boosting efficiency of a channel voltage is improved. In the result, a program disturbance can be prevented by the boosting of the channel voltage.

Figure 14:
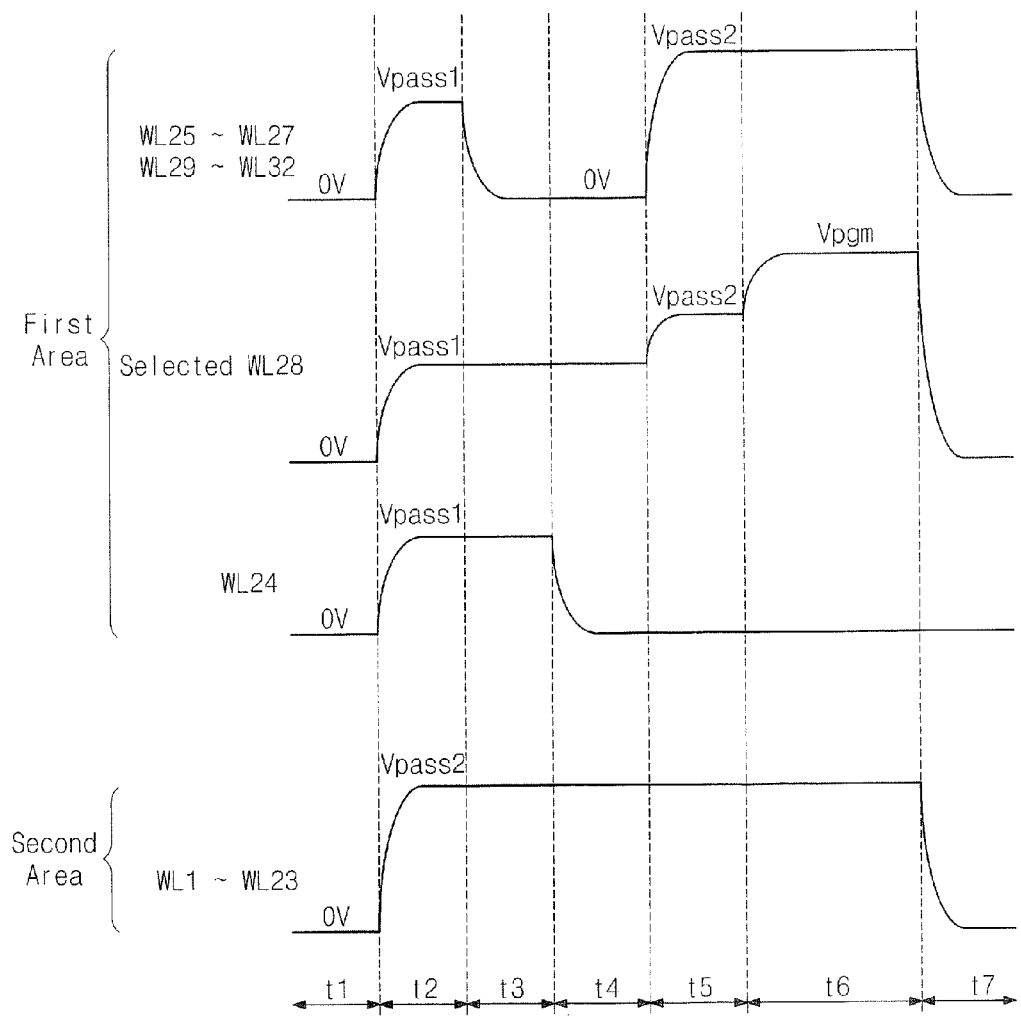
FIG. 14 is a timing diagram illustrating methods for programming a nonvolatile memory device according to some embodiments.

Referring now to FIG. 14, a timing diagram illustrating a method for programming a nonvolatile memory device according to some embodiments will be discussed. As illustrated in FIG. 14, a program method according to some embodiments includes steps t1 to t7. In step t1, a ground voltage 0V is applied to word lines WL1~WL32 for initialization.

In step t2, word lines of a first area are driven by a first pass voltage Vpass1. The first pass voltage Vpass1 is applied to turn on transistors of the first area. Also, word lines of a second area are driven by a second pass voltage Vpass2. The second pass voltage Vpass2 is applied to turn on transistors of the second area. The second pass voltage Vpass2 has a higher level than the first pass voltage Vpass1.

As the word lines of the first area and the word lines of the second area are driven respectively by the first pass voltage Vpass1 and the second pass voltage Vpass2, electrons in a channel transfer. This will be described later in detail with reference to FIG. 15. Also, as the first area is driven by the first pass voltage Vpass1 lower than the second pass voltage Vpass2, the degradation of a transistor in the first area is decreased.

In step t3, the word lines of the first area are driven by the ground voltage 0V. As the word lines of the first area are driven by the ground voltage 0V, the channel voltage of the second area becomes higher than the channel voltage of the first area. Due to the voltage difference, the electrons in the first area transfer to the second area. Accordingly, the electron density of the first area decreases. Also, as the word lines of the first area are driven by the ground voltage 0V lower than the pass voltage, the degradation of transistor insulating layers connected respectively to the word lines can be prevented.

In step t4, the ground voltage 0V is applied to the word line WL24 to turn off a transistor connected to the word line WL24. As the transistor is turned off, the channel is isolated.

In step t5, the selected word line WL28 and the unselected word lines of the first area are driven by the second pass voltage Vpass2. By application of the second pass voltage Vpass2, the channel voltage of the first area increases.

In step t6, the selected word line WL28 is driven by a program voltage Vpgm. By application of the program voltage Vpgm, the channel voltage of the first area increases. Due to the increased channel voltage, an unselected memory cell MC2 is not programmed. In step t7, the respective word lines are driven by the ground voltage V0 for recovery.

Figure 15:
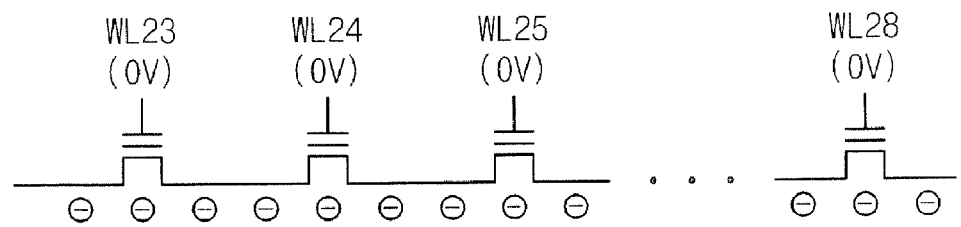
FIG. 15 is a diagram illustrating the electron distribution in a channel in periods t1 to t4 of FIG. 14.
Figure 15:
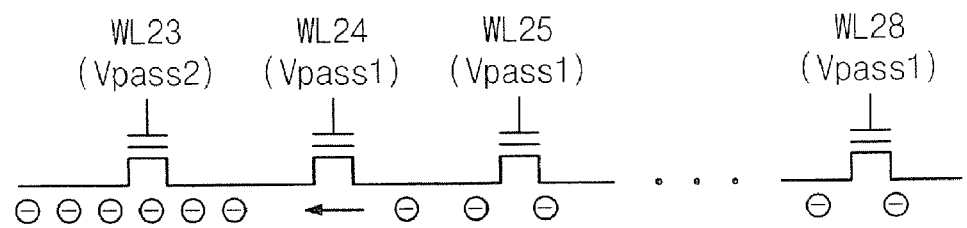
Figure 15:
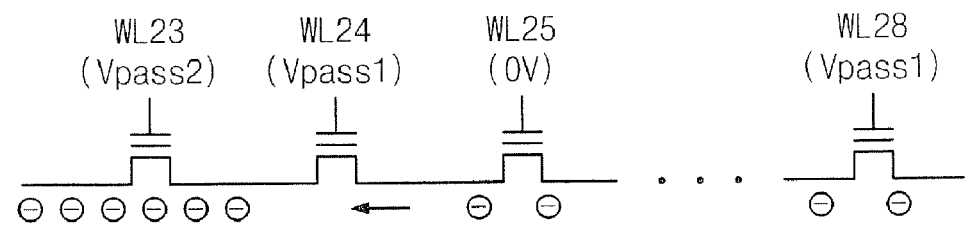
Figure 15:
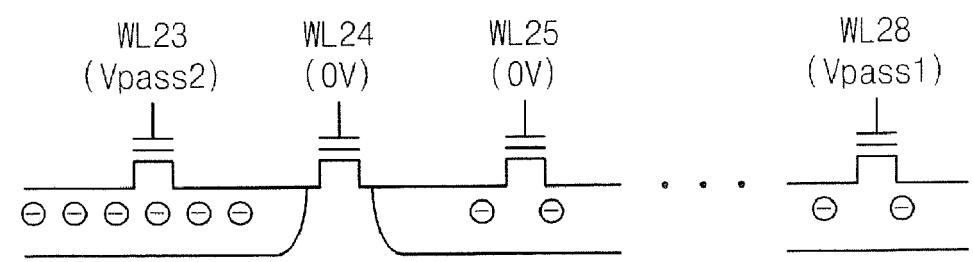

Referring now to FIG. 15, a diagram illustrating the electron distribution in a channel in the periods t1 to t4 of FIG. 14 will be discussed. FIG. 15(a) illustrates the electron distribution in the channel in the period t1 of FIG. 14 (t=t1). Referring to FIG. 15(a), when the ground voltage 0V is applied to the word lines WL1~WL32, the electrons of the channel are distributed in a uniform density.

FIG. 15(b) illustrates the electron distribution in the channel in the period t2 of FIG. 14 (t=t2). Referring to FIG. 15(b), the relatively-high second pass voltage Vpass2 is applied to the word lines WL1~WL23, and the relatively-low first pass voltage Vpass1 is applied to the word lines WL24~WL32. Accordingly, the electrons transfer to the word line WL23.

Thus, the channel of the first area has a low electron density, and the channel of the second area has a high electron density. The first area with a low electron density has an improved boosting efficiency. In the result, a program disturbance can be prevented. Also, because the relatively-low first pass voltage Vpass1 is applied to the word line of the first area, the degradation of a transistor insulating layer can be decreased.

FIG. 15(c) illustrates the electron distribution in the channel in the period t3 of FIG. 14 (t=t3). Referring to FIG. 15(c), as the ground voltage 0V is applied to the word lines WL25~WL27 and WL29~WL32, a channel voltage corresponding to the word lines WL25~WL27 and WL29~WL32 decreases. As the channel voltage decreases, the electrons of the first area transfer to the second area. Accordingly, the electron density of the first area decreases. Also, as the word lines WL25~WL27 and WL29~WL32 of the first area are driven by the ground voltage 0V lower than the pass voltage, the degradation of transistor insulating layers connected respectively to the word lines WL25~WL27 and WL29~WL32 can be prevented.

FIG. 15(d) illustrates the electron distribution in the channel in the period t4 of FIG. 14 (t=t4). Referring to FIG. 15(d), the ground voltage 0V is applied to the word line WL24 to turn off a transistor connected to the word line WL24. As the transistor is turned off, the channel is isolated. In the result, the channel electron density of the first area decreases. When the channel electron density decreases, the boosting efficiency of a channel voltage increases. In the inventive concept, the self-boosting efficiency can be improved by decreasing the electron density of the channel corresponding to the selected word line.

Figure 16:
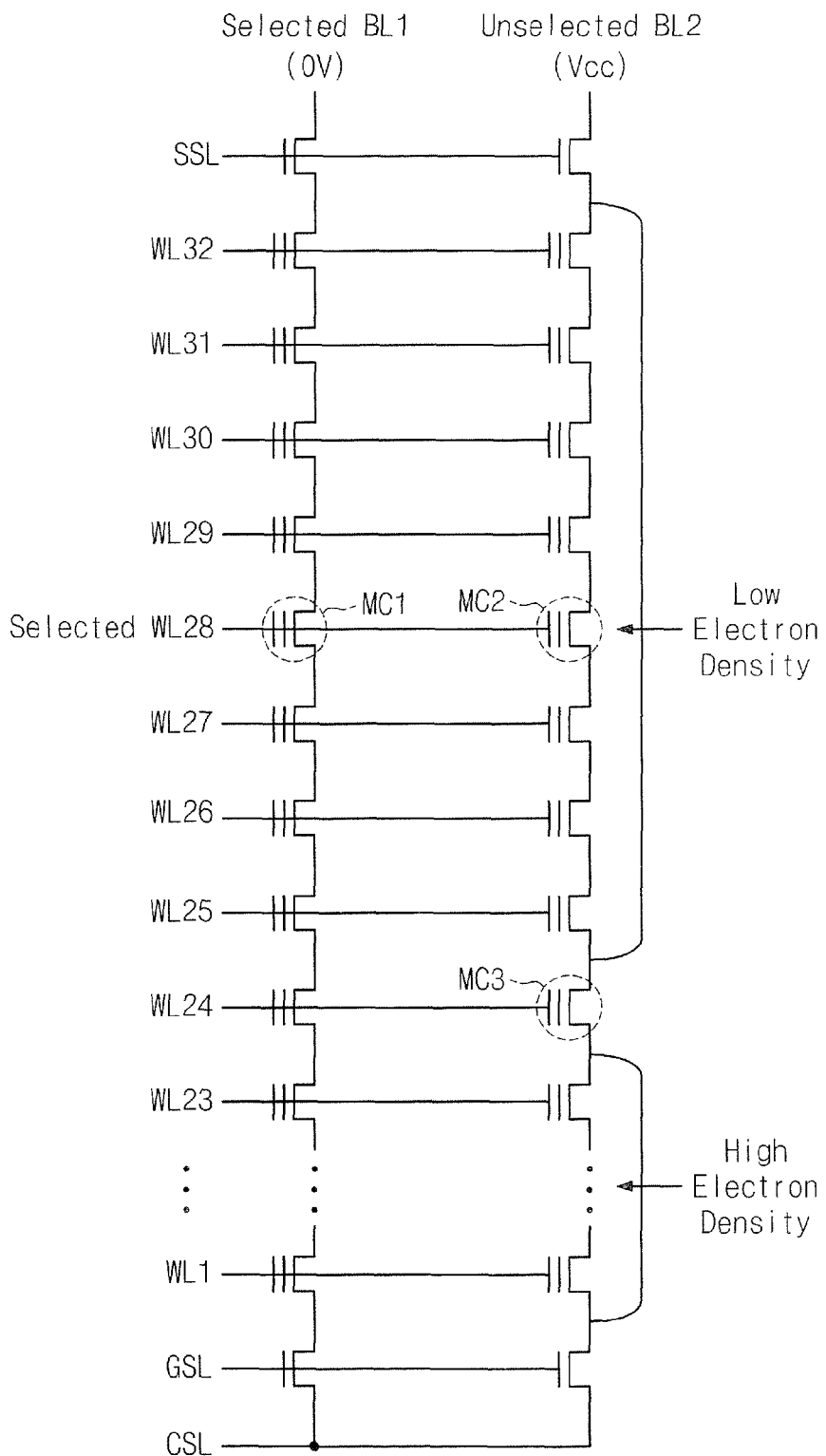
FIG. 16 is a diagram illustrating the channel isolation in a program method according to some embodiments.

Referring now to FIG. 16, a diagram illustrating the channel isolation in a program method according to some embodiments will be discussed. As illustrated in FIG. 16, as a transistor MC3 is turned off, a channel is isolated. Due to the electron transfer described with reference to FIG. 15, a channel corresponding to a selected word line has a low electron density while a channel not corresponding to the selected word line has a high electron density. Because the channel corresponding to the selected word line has a low electron density, the boosting efficiency of a channel voltage is improved. In the result, a program disturbance can be prevented by the boosting of the channel voltage.

Figure 17:
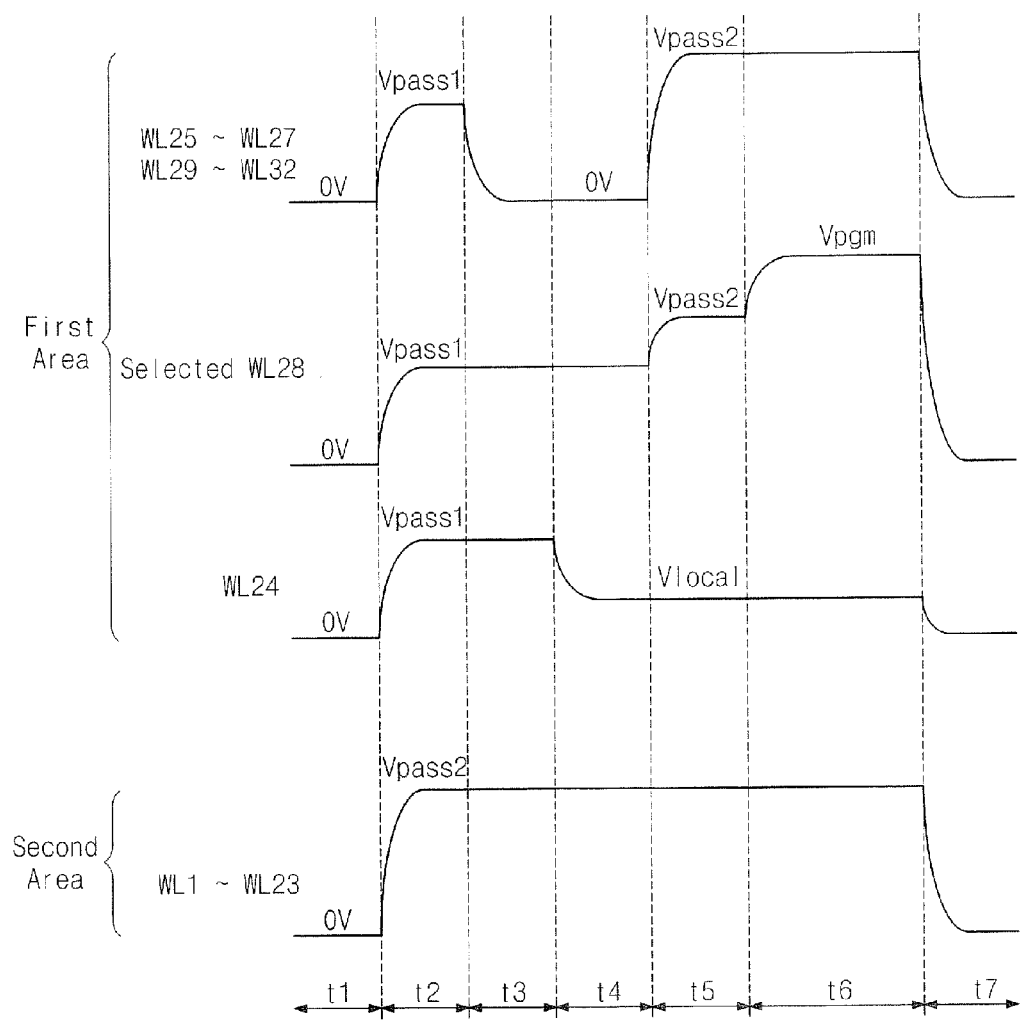
FIG. 17 is a timing diagram illustrating methods for programming a nonvolatile memory device according to some embodiments.

Referring now to FIG. 17, a timing diagram illustrating a method for programming a nonvolatile memory device according to some embodiments will be discussed. As illustrated in FIG. 17, a program method according to some embodiments includes steps t1 to t7. In step t1, a ground voltage 0V is applied to word lines WL1~WL32 for initialization.

In step t2, word lines WL24~WL32 of a first area are driven by a first pass voltage Vpass1. The first pass voltage Vpass1 is applied to turn on transistors of the first area. Also, word lines WL1~WL23 of a second area are driven by a second pass voltage Vpass2. The second pass voltage Vpass2 is applied to turn on transistors of the second area. The second pass voltage Vpass2 has a higher level than the first pass voltage Vpass1.

As the word lines of the first area and the word lines of the second area are driven respectively by the first pass voltage Vpass1 and the second pass voltage Vpass2, electrons in a channel transfer. This will be described later in detail with reference to FIG. 18. Also, as the first area is driven by the first pass voltage Vpass1 lower than the second pass voltage Vpass2, the degradation of a transistor insulating layer in the first area is decreased.

In step t3, the word lines of the first area are driven by the ground voltage 0V. As the word lines of the first area are driven by the ground voltage 0V, the channel voltage of the second area becomes higher than the channel voltage of the first area.

Due to the voltage difference, the electrons in the first area transfer to the second area. Accordingly, the electron density of the first area decreases. Also, as the word lines of the first area are driven by the ground voltage 0V lower than the pass voltage, the degradation of transistors connected respectively to the word lines can be prevented.

In step t4, the local voltage Vlocal is applied to the word line. The local voltage Vlocal is higher than the ground voltage V0 and is lower than the first pass voltage Vpass1. The level of the local voltage Vlocal is set to turn off a transistor connected to the word line WL24. By application of the local voltage Vlocal, the transistor connected to the word line WL24 is turned off. Accordingly, the channel is isolated.

Also, the local voltage Vlocal is applied to the unselected word line WL24, thereby preventing a sudden change in the channel voltage. The inventive concept is not limited to the above bias conditions. For example, no or some word lines may be disposed between the selected word line WL28 and the unselected word line WL24. Also in this case, the boosting efficiency can be improved by the channel isolation.

In step t5, the selected word line WL28 and the unselected word lines of the first area are driven by the second pass voltage Vpass2. By application of the second pass voltage Vpass2, the channel voltage of the first area increases.

In step t6, the selected word line WL28 is driven by a program voltage Vpgm. By application of the program voltage Vpgm, the channel voltage of the first area increases. Due to the increased channel voltage, an unselected memory cell MC2 is not programmed. In step t7, the respective word lines are driven by the ground voltage V0 for recovery.

Figure 18:
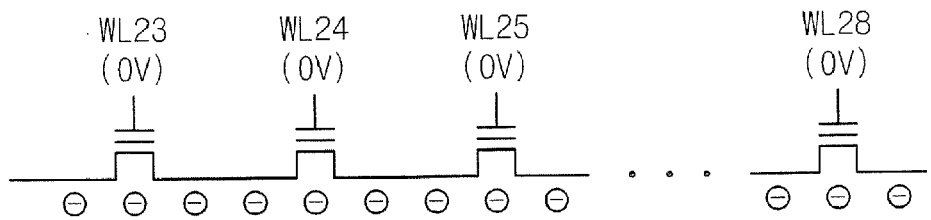
FIG. 18 is a diagram illustrating the electron distribution in a channel in periods t1 to t4 of FIG. 17.
Figure 18:
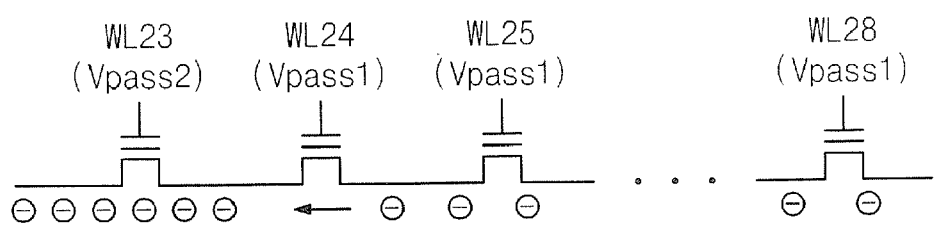
Figure 18:
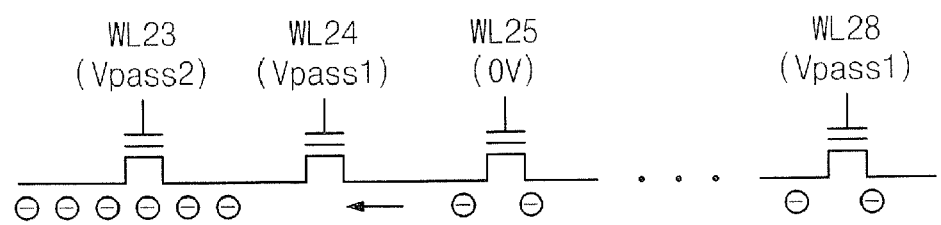
Figure 18:
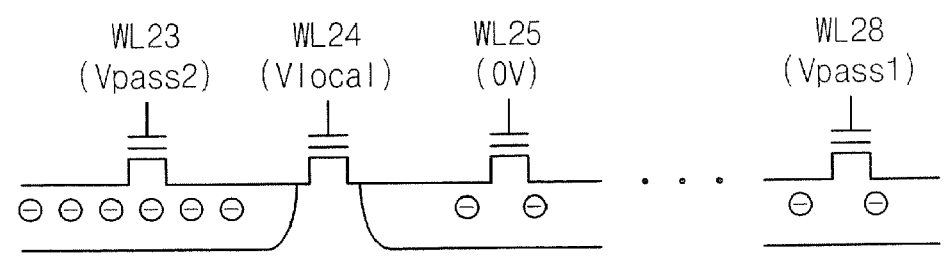

Referring now to FIG. 18, a diagram illustrating the electron distribution in a channel in the periods t1 to t4 of FIG. 17 will be discussed. FIG. 18(a) illustrates the electron distribution in the channel in the period t1 of FIG. 17 (t=t1). Referring to FIG. 18(a), when the ground voltage 0V is applied to the word lines WL1~WL32, the electrons of the channel are distributed in a uniform density.

FIG. 18(b) illustrates the electron distribution in the channel in the period t2 of FIG. 17 (t=t2). Referring to FIG. 18(b), the relatively-high second pass voltage Vpass2 is applied to the word lines WL1~WL23, and the relatively-low first pass voltage Vpass1 is applied to the word lines WL24~WL32. Accordingly, the electrons transfer to the word line WL23.

Thus, the channel of the first area has a low electron density, and the channel of the second area has a high electron density. The first area with a low electron density has an improved boosting efficiency. In the result, a program disturbance can be prevented. Also, because the relatively-low first pass voltage Vpass1 is applied to the word line of the first area, the degradation of a transistor insulating layer can be decreased.

FIG. 18(c) illustrates the electron distribution in the channel in the period t3 of FIG. 17 (t=t3). Referring to FIG. 18(c), as the ground voltage 0V is applied to the word lines WL25~WL27 and WL29~WL32, a channel voltage corresponding to the word lines WL25~WL27 and WL29~WL32 decreases. As the channel voltage decreases, the electrons of the first area transfer to the second area. Accordingly, the electron density of the first area decreases. Also, as the word lines of the first area are driven by the ground voltage 0V lower than the pass voltage, the degradation of transistors connected respectively to the word lines can be prevented.

FIG. 18(d) illustrates the electron distribution in the channel in the period t4 of FIG. 17 (t=t4). Referring to FIG. 18(d), the local voltage Vlocal is applied to the word line WL24 to turn off a transistor connected to the word line WL24. As the transistor is turned off, the channel is isolated.

Due to the above electron transfer, the channel electron density of the first area decreases. When the channel electron density decreases, the boosting efficiency of a channel voltage increases. In the inventive concept, the self-boosting efficiency is improved by decreasing the electron density of the channel corresponding to the selected word line. Also, a sudden change in the channel voltage is prevented by applying the local voltage Vlocal to the unselected word line WL24.

Figure 19:
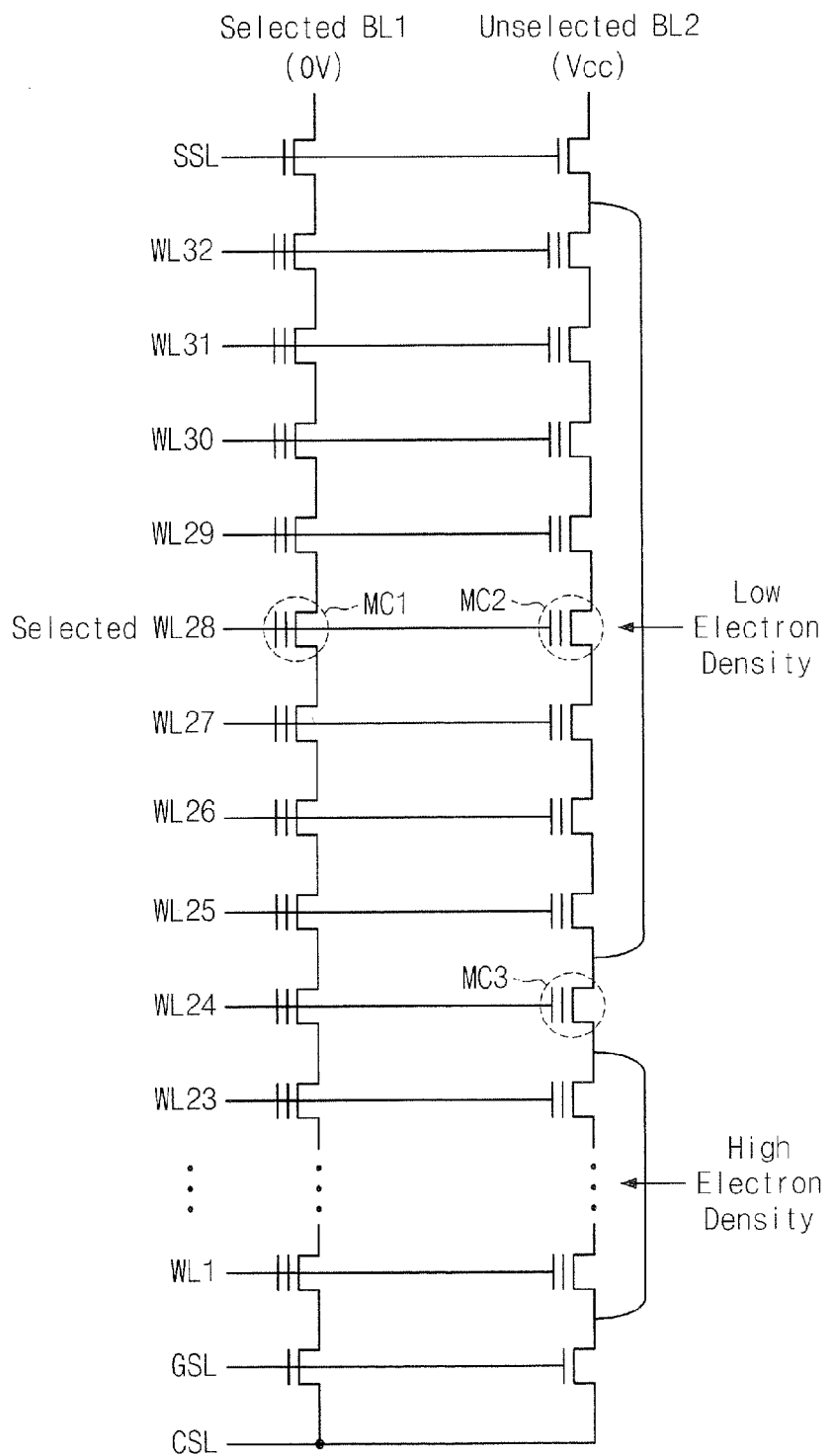
FIG. 19 is a diagram illustrating the channel isolation in a program method according to some embodiments.

Referring now to FIG. 19, a diagram illustrating the channel isolation in a program method according to some embodiments will be discussed. As illustrated in FIG. 19, as a transistor MC3 is turned off, a channel is isolated. Due to the electron transfer described with reference to FIG. 18, a channel corresponding to a selected word line has a low electron density while a channel not corresponding to the selected word line has a high electron density. Because the channel corresponding to the selected word line has a low electron density, the boosting efficiency of a channel voltage is improved. In the result, a program disturbance can be prevented by the boosting of the channel voltage.

Figure 20:
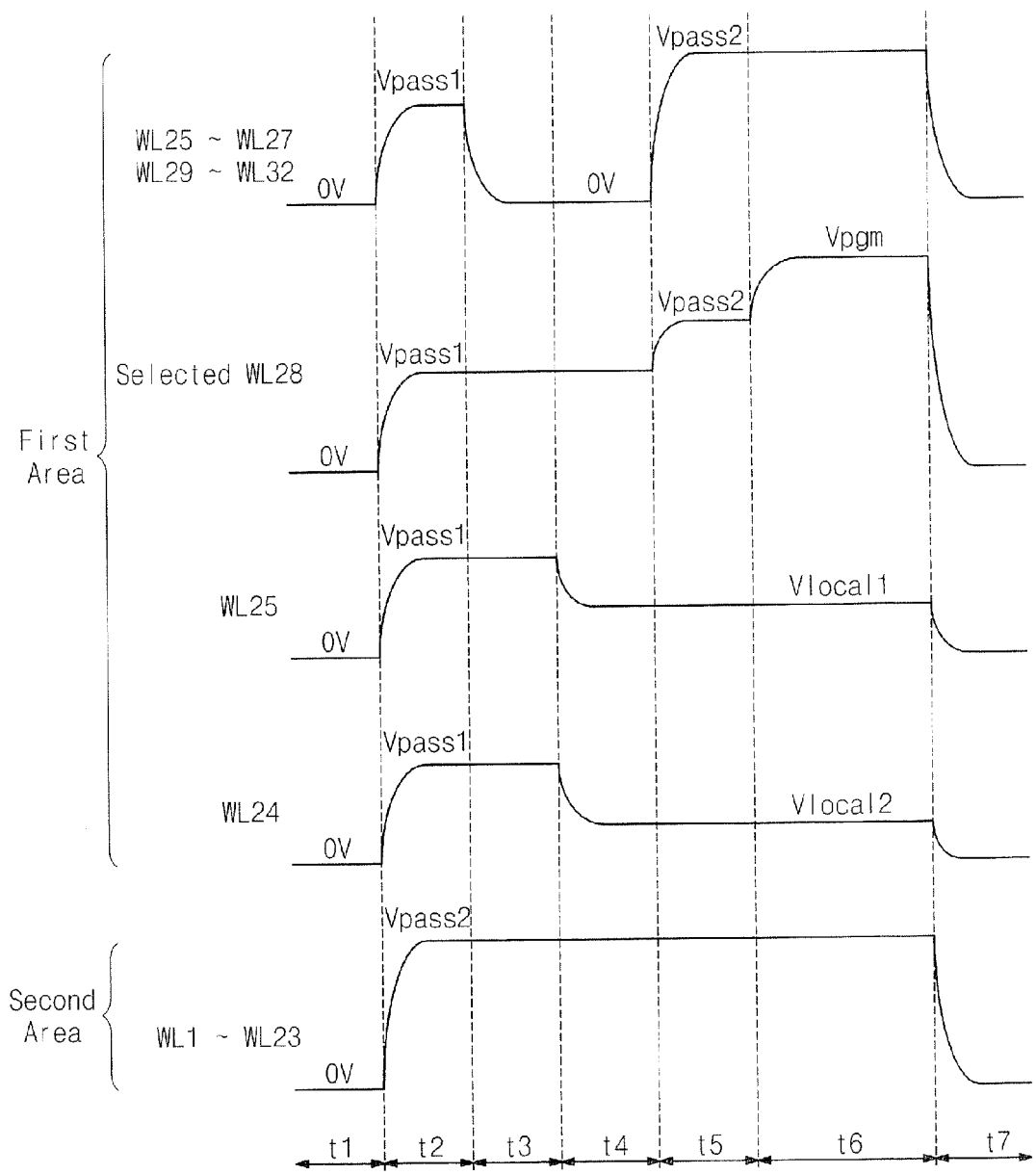
FIG. 20 is a timing diagram illustrating methods for programming a nonvolatile memory device according to some embodiments.

Referring now to FIG. 20, a timing diagram illustrating a method for programming a nonvolatile memory device according to some embodiments will be discussed. As illustrated in FIG. 20, a program method according to some embodiments includes steps t1 to t7. In step t1, word lines WL1~WL32 are driven by a ground voltage 0V for initialization.

In step t2, word lines WL24~WL32 of a first area are driven by a first pass voltage Vpass1. The first pass voltage Vpass1 is applied to turn on transistors of the first area. Also, word lines of a second area are driven by a second pass voltage Vpass2. The second pass voltage Vpass2 is applied to turn on transistors of the second area. The second pass voltage Vpass2 has a higher level than the first pass voltage Vpass1.

As the word lines of the first area and the word lines of the second area are driven respectively by the first pass voltage Vpass1 and the second pass voltage Vpass2, electrons in a channel transfer. This will be described later in detail with reference to FIG. 21. Also, as the first area is driven by the first pass voltage Vpass1 lower than the second pass voltage Vpass2, the degradation of a transistor insulating layer in the first area is decreased.

In step t3, the word lines of the first area are driven by the ground voltage 0V. As the word lines of the first area are driven by the ground voltage 0V, the channel voltage of the second area becomes higher than the channel voltage of the first area. Due to the voltage difference, the electrons in the first area transfer to the second area. Accordingly, the electron density of the first area decreases. Also, as the word lines of the first area are driven by the ground voltage 0V lower than the pass voltage, the degradation of transistors connected respectively to the word lines can be prevented.

In step t4, a first local voltage Vlocal1 is applied to the word line WL25 and a second local voltage Vlocal2 is applied to the word line WL24. The first local voltage Vlocal1 may have a higher level than the second local voltage Vlocal2.

In this embodiment, the first local voltage Vlocal1 and the second local voltage Vlocal2 are applied respectively to the unselected word lines WL25 and WL24, thereby preventing a sudden change in the channel voltage. Also, the selected word line WL26 and the word line WL25 are spaced, thereby preventing the problem caused by the sudden boosting of a channel voltage.

The inventive concept is not limited to the above bias conditions. For example, no or some word lines may be disposed between the selected word line WL28 and the unselected word lines WL25 and WL24.

In step t5, the selected word line WL28 and the unselected word lines of the first area are driven by the second pass voltage Vpass2. By application of the second pass voltage Vpass2, the channel voltage of the first area increases.

In step t6, the selected word line WL28 is driven by a program voltage Vpgm. By application of the program voltage Vpgm, the channel voltage of the first area increases. Due to the increased channel voltage, an unselected memory cell MC2 is not programmed. In step t7, the respective word lines are driven by the ground voltage V0 for recovery.

Figure 21:
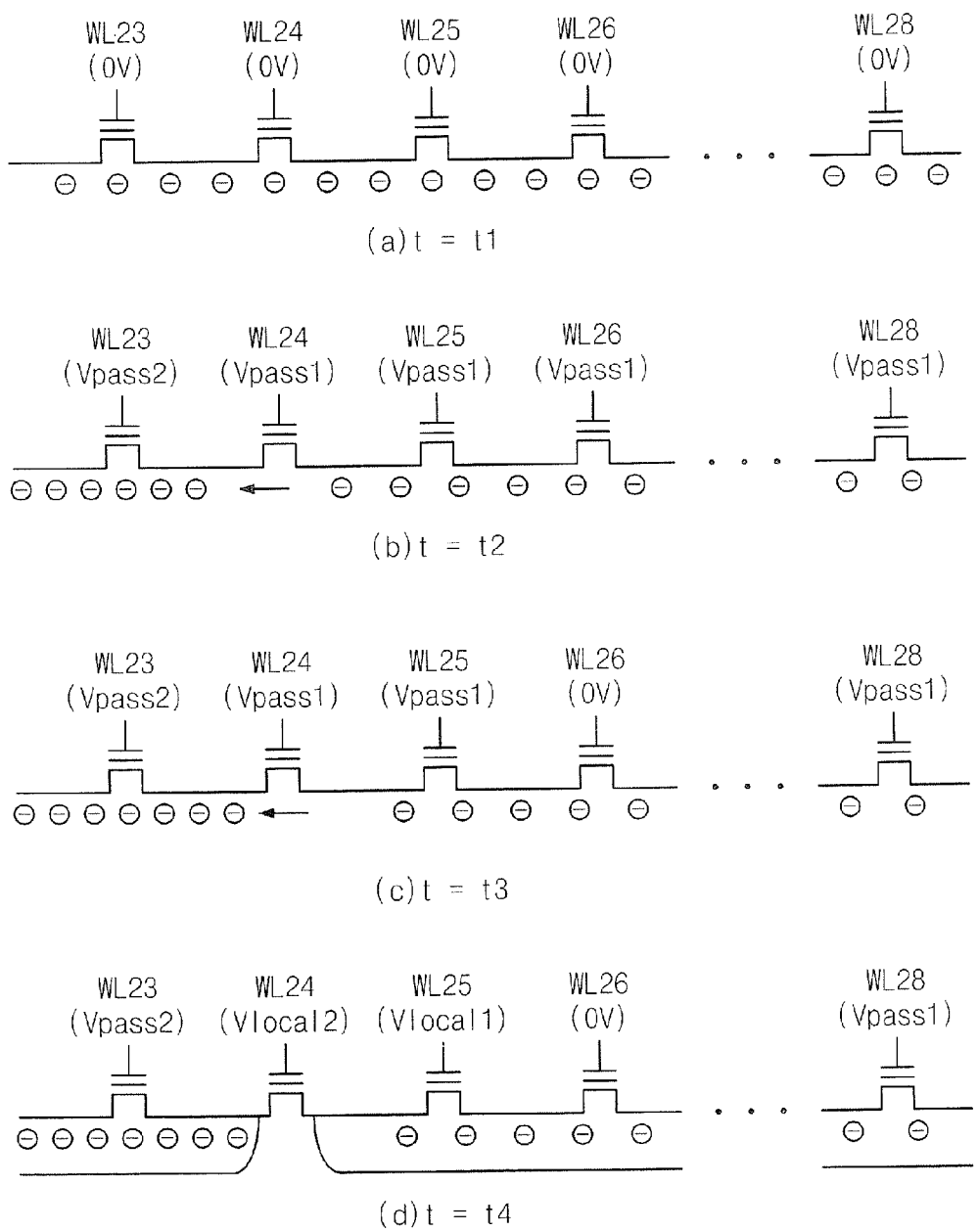
FIG. 21 is a diagram illustrating the electron distribution in a channel in periods t1 to t4 of FIG. 20.

Referring now to FIG. 21, a diagram illustrating the electron distribution in a channel in the periods t1 to t4 of FIG. 20 will be discussed. FIG. 21(a) illustrates the electron distribution in the channel in the period t1 of FIG. 20 (t=t1). Referring to FIG. 21(a), when the ground voltage 0V is applied to the word lines WL1~WL32, the electrons of the channel are distributed uniformly.

FIG. 21(b) illustrates the electron distribution in the channel in the period t2 of FIG. 20 (t=t2). Referring to FIG. 21(b), the relatively-high second pass voltage Vpass2 is applied to the word lines WL1~WL23, and the relatively-low first pass voltage Vpass1 is applied to the word lines WL24~WL32. Accordingly, the electrons transfer to the word line WL23 (i.e., the second area).

Thus, the channel of the first area has a low electron density, and the channel of the second area has a high electron density. The first area with a low electron density has an improved boosting efficiency. In the result, a program disturbance can be prevented. Also, because the relatively-low first pass voltage Vpass1 is applied to the word line of the first area, the degradation of a transistor insulating layer can be decreased.

FIG. 21(c) illustrates the electron distribution in the channel in the period t3 of FIG. 20 (t=t3). Referring to FIG. 21(c), as the word lines WL26~WL27 and WL29~WL32 are driven by the ground voltage 0V, a channel voltage corresponding to the word lines WL26~WL27 and WL29~WL32 decreases. As the channel voltage decreases, the electrons of the first area transfer to the second area. Accordingly, the electron density of the first area decreases. Also, as the word lines of the first area are driven by the ground voltage 0V lower than the pass voltage, the degradation of transistors connected respectively to the word lines can be prevented.

FIG. 21(d) illustrates the electron distribution in the channel in the period t4 of FIG. 20 (t=t4). Referring to FIG. 21(d), the second local voltage Vlocal2 is applied to the word line WL24 to turn off a transistor connected to the word line WL24. As the transistor is turned off, the channel is isolated. In the result, the channel electron density of the first area decreases. When the channel electron density decreases, the boosting efficiency of a channel voltage increases. In the inventive concept, the self-boosting efficiency is improved by decreasing the electron density of the channel corresponding to the selected word line. Also, a sudden change in the channel voltage is prevented by applying the first local voltage Vlocal1 to the unselected word line WL25.

Figure 22:
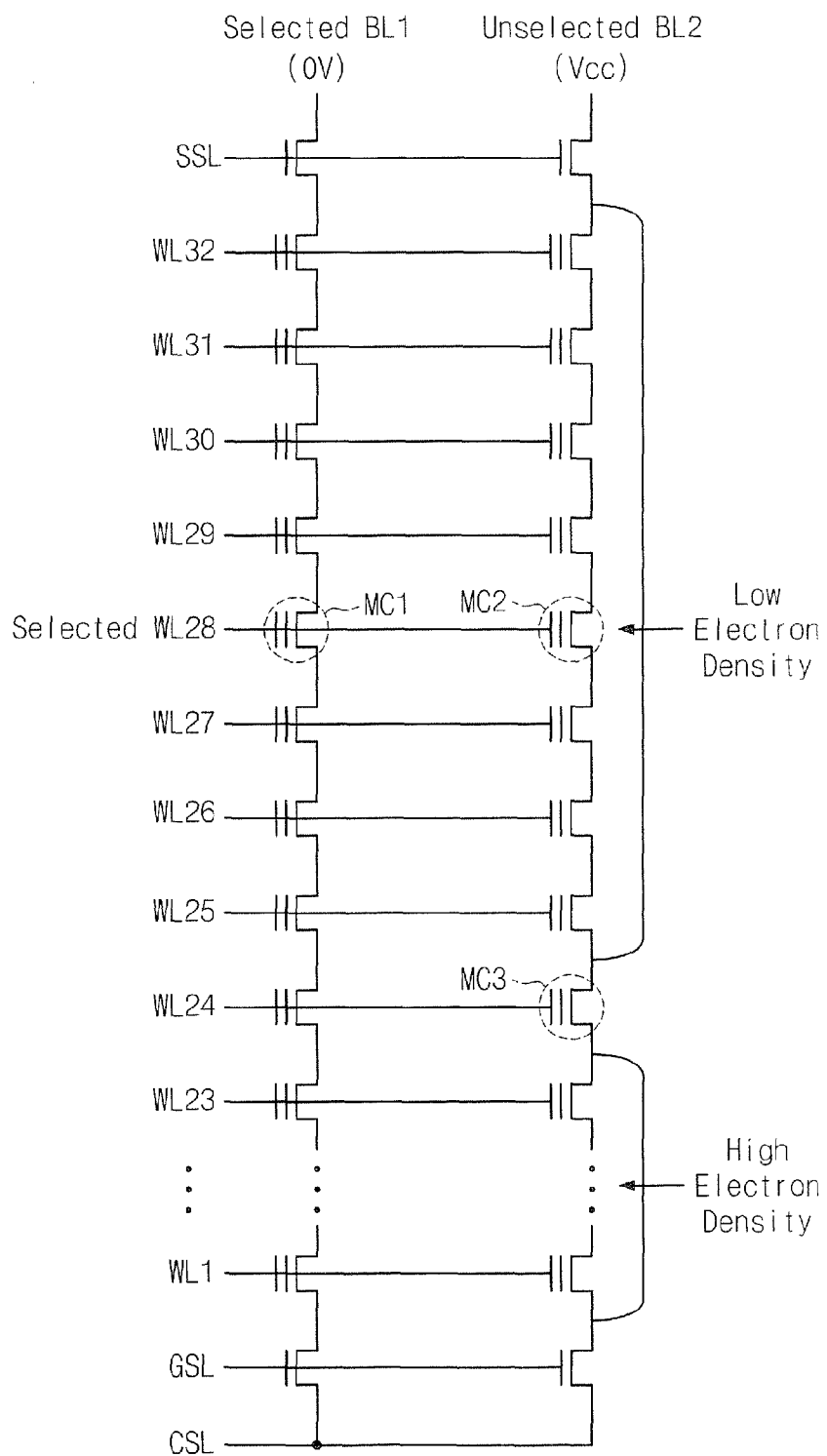
FIG. 22 is a diagram illustrating the channel isolation in a program method according to some embodiments.

Referring now to FIG. 22, a diagram illustrating the channel isolation in a program method according to some embodiments will be discussed. As illustrated in FIG. 22, as a transistor MC3 is turned off, a channel is isolated. Due to the electron transfer described with reference to FIG. 21, a channel corresponding to a selected word line has a low electron density while a channel not corresponding to the selected word line has a high electron density. Because the channel corresponding to the selected word line has a low electron density, the boosting efficiency of a channel voltage is improved. In the result, a program disturbance can be prevented by the boosting of the channel voltage.

Figure 23:
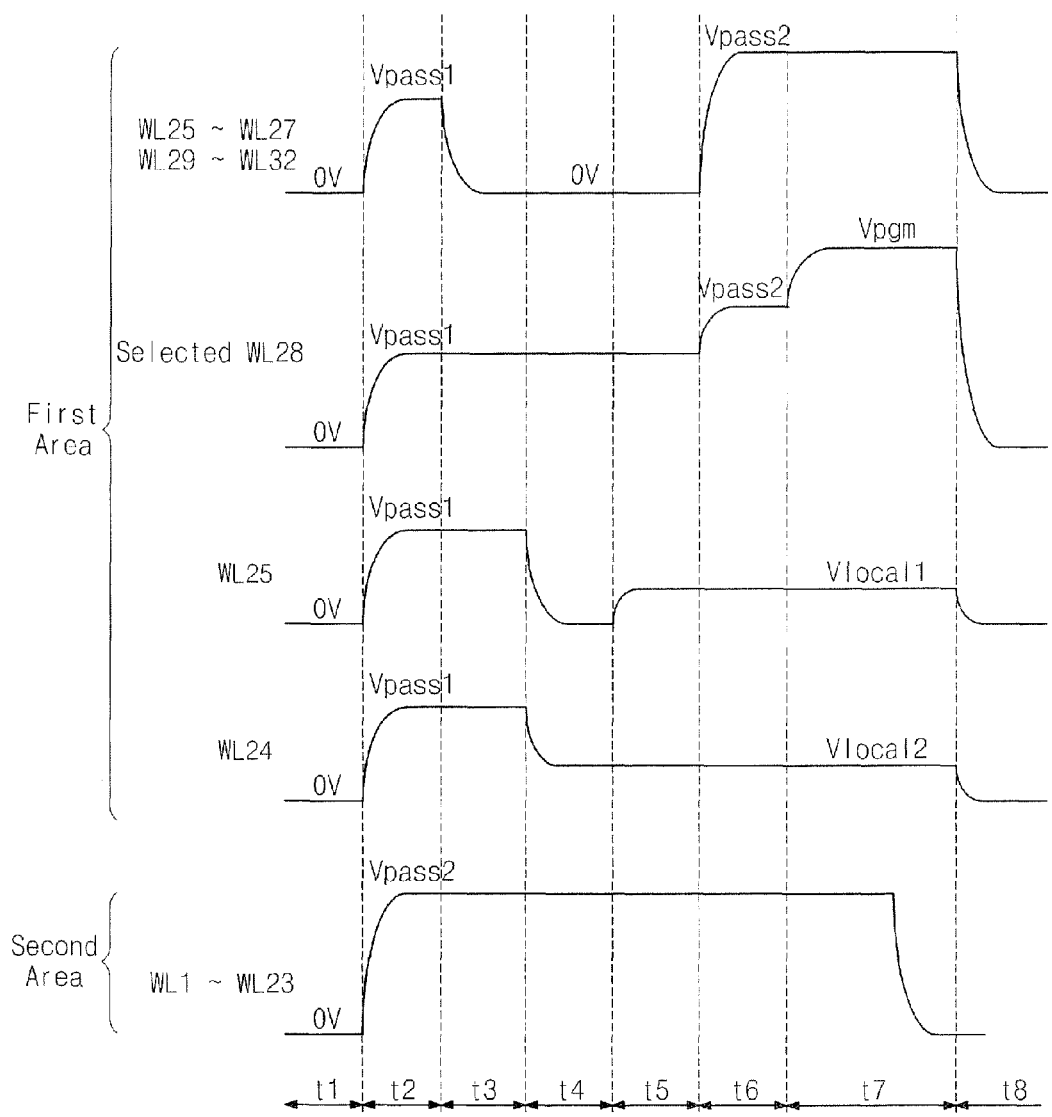
FIG. 23 is a timing diagram illustrating methods for programming a nonvolatile memory device according to some embodiments.

Referring now to FIG. 23, a timing diagram illustrating a method for programming a nonvolatile memory device according to some embodiments will be discussed. As illustrated in FIG. 23, a program method according to some embodiments includes steps t1 to t8. In step t1, word lines WL1~WL32 are driven by a ground voltage 0V for initialization.

In step t2, word lines WL24~WL32 of a first area are driven by a first pass voltage Vpass1. The first pass voltage Vpass1 is applied to turn on transistors of the first area. Also, word lines WL1~WL23 of a second area are driven by a second pass voltage Vpass2. The second pass voltage Vpass2 is applied to turn on transistors of the second area. The second pass voltage Vpass2 has a higher level than the first pass voltage Vpass1.

As the word lines of the first area and the word lines of the second area are driven respectively by the first pass voltage Vpass1 and the second pass voltage Vpass2, electrons in a channel transfer. This will be described later in detail with reference to FIG. 24. Also, as the first area is driven by the first pass voltage Vpass1 lower than the second pass voltage Vpass2, the degradation of a transistor insulating layer in the first area is decreased.

In step t3, the word lines WL26~WL27 and WL29~WL32 of the first area are driven by the ground voltage 0V. As the word lines WL26~WL27 and WL29~WL32 of the first area are driven by the ground voltage 0V, the channel voltage of the second area becomes higher than the channel voltage of the first area.

Due to the voltage difference, the electrons in the first area transfer to the second area. Accordingly, the electron density of the first area decreases. Also, as the word lines of the first area are driven by the ground voltage 0V lower than the pass voltage, the degradation of transistors connected respectively to the word lines can be prevented.

In step t4, the word line WL25 is driven by the ground voltage 0V, and the second local voltage Vlocal2 is applied to the word line WL24. Accordingly, the channel voltage corresponding to the word line WL24 becomes higher than the channel voltage corresponding to the word line WL25. Due to the voltage difference, the electrons of the first area transfer to the second area.

In step t5, the word line WL25 is driven by the first local voltage Vlocal1. The first local voltage Vlocal1 has a higher level than the second local voltage Vlocal2.

In this embodiment, the unselected word lines WL25 and WL24 are driven respectively by the first local voltage Vlocal1 and the second local voltage Vlocal2, thereby preventing a sudden change in the channel voltage. Also, the selected word line WL28 and the word lines WL25 and WL24 are spaced, thereby preventing the problem caused by the sudden boosting of a channel voltage.

The inventive concept is not limited to the above bias conditions. For example, no or some word lines may be disposed between the selected word line WL28 and the word line WL25.

In step t6, the selected word line WL28 and the unselected word lines of the first area are driven by the second pass voltage Vpass2. By application of the second pass voltage Vpass2, the channel voltage of the first area increases.

In step t7, the selected word line WL28 is driven by a program voltage Vpgm. By application of the program voltage Vpgm, the channel voltage of the first area increases. Due to the increased channel voltage, an unselected memory cell MC2 is not programmed. In step t8, the respective word lines are driven by the ground voltage V0 for recovery.

Figure 24:
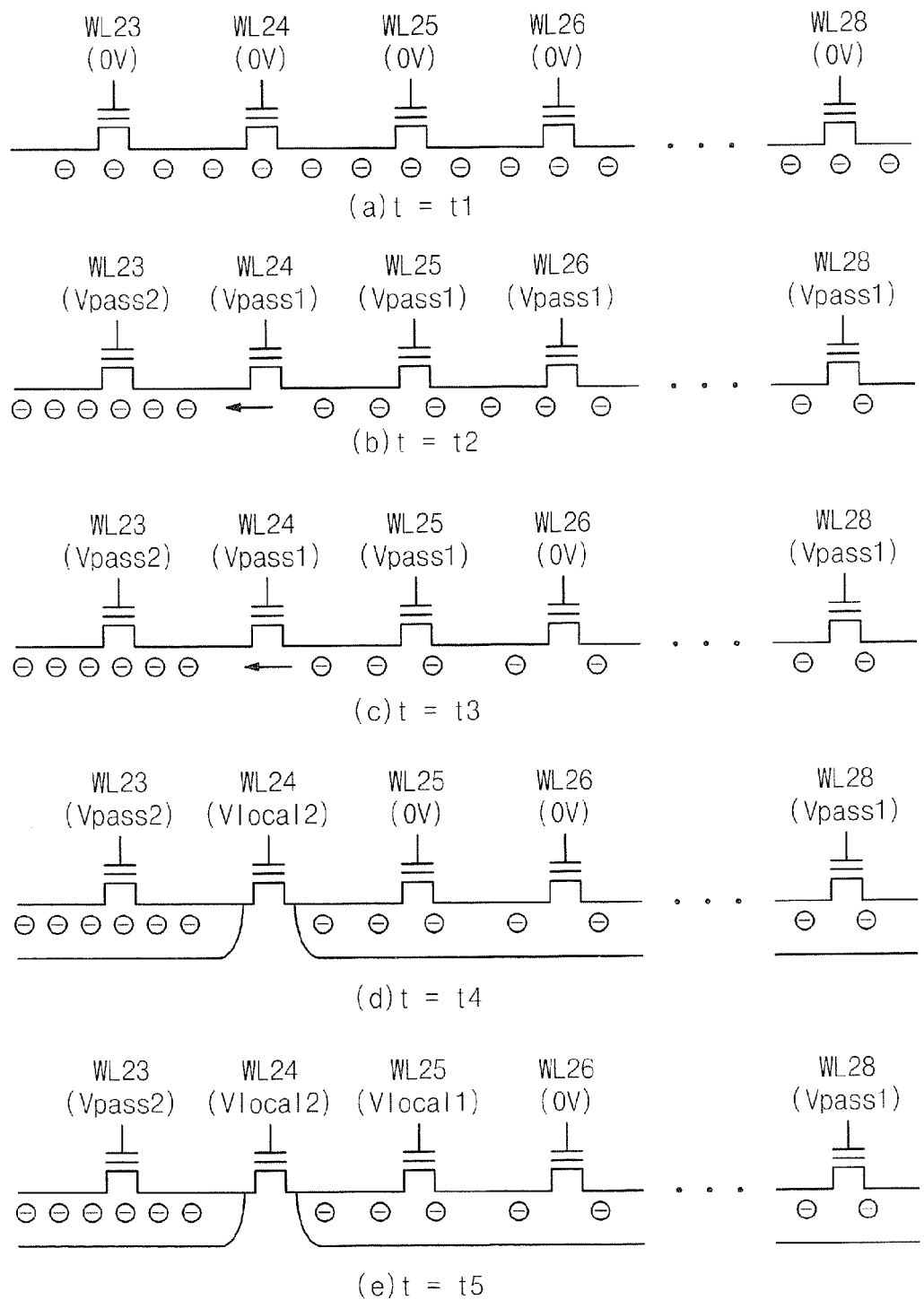
FIG. 24 is a diagram illustrating the electron distribution in a channel in periods t1 to t5 of FIG. 23.

Referring now to FIG. 24, a diagram illustrating the electron distribution in a channel in the periods t1 to t5 of FIG. 23 will be discussed. FIG. 24(a) illustrates the electron distribution in the channel in the period t1 of FIG. 23 (t=t1). Referring to FIG. 24(a), when the ground voltage 0V is applied to the word lines WL1~WL26, the electrons of the channel are distributed in a uniform density.

FIG. 24(b) illustrates the electron distribution in the channel in the period t2 of FIG. 23 (t=t2). Referring to FIG. 24(b), the relatively-high second pass voltage Vpass2 is applied to the word lines WL1~WL23, and the relatively-low first pass voltage Vpass1 is applied to the word lines WL24~WL32. Accordingly, the electrons transfer to the word line WL23 (i.e., the second area).

Due to the electron transfer, the channel of the first area has a low electron density, and the channel of the second area has a high electron density. The first area with a low electron density has an improved boosting efficiency. In the result, a program disturbance can be prevented. Also, because the relatively-low first pass voltage Vpass1 is applied to the word line of the first area, the degradation of a transistor can be decreased.

FIG. 24(c) illustrates the electron distribution in the channel in the period t3 of FIG. 23 (t=t3). Referring to FIG. 24(c), as the ground voltage 0V is applied to the word lines WL26~WL27 and WL29~WL32, a channel voltage corresponding to the word lines WL26~WL27 and WL29~WL32 decreases. As the channel voltage decreases, the electrons of the first area transfer to the second area. Accordingly, the electron density of the first area decreases. Also, as the word lines of the first area are driven by the ground voltage 0V lower than the pass voltage, the degradation of transistors connected respectively to the word lines can be prevented.

FIG. 24(d) illustrates the electron distribution in the channel in the period t4 of FIG. 23 (t=t4). Referring to FIG. 24(d), as the word line WL25 is driven by the ground voltage 0V, the electrons of the first area transfer to the second area. Also, the second local voltage Vlocal2 is applied to the word line WL24 to turn off a transistor connected to the word line WL24. As the transistor is turned off, the channel is isolated. In the result, the channel electron density of the first area decreases. When the channel electron density decreases, the boosting efficiency of a channel voltage increases. In the inventive concept, the self-boosting efficiency is improved by decreasing the electron density of the channel corresponding to the selected word line.

FIG. 24(e) illustrates the electron distribution in the channel in the period t5 of FIG. 23 (t=t5). Referring to FIG. 24(e), the first local voltage Vlocal1 is applied to the word line WL25. In this embodiment, the first local voltage Vlocal1 and the second local voltage Vlocal2 are applied respectively to the unselected word lines WL25 and WL24, thereby preventing a sudden change in the channel voltage. Also, the selected word line WL28 and the word lines WL25 and WL24 are spaced, thereby preventing the problem caused by the sudden boosting of a channel voltage.

Figure 25:
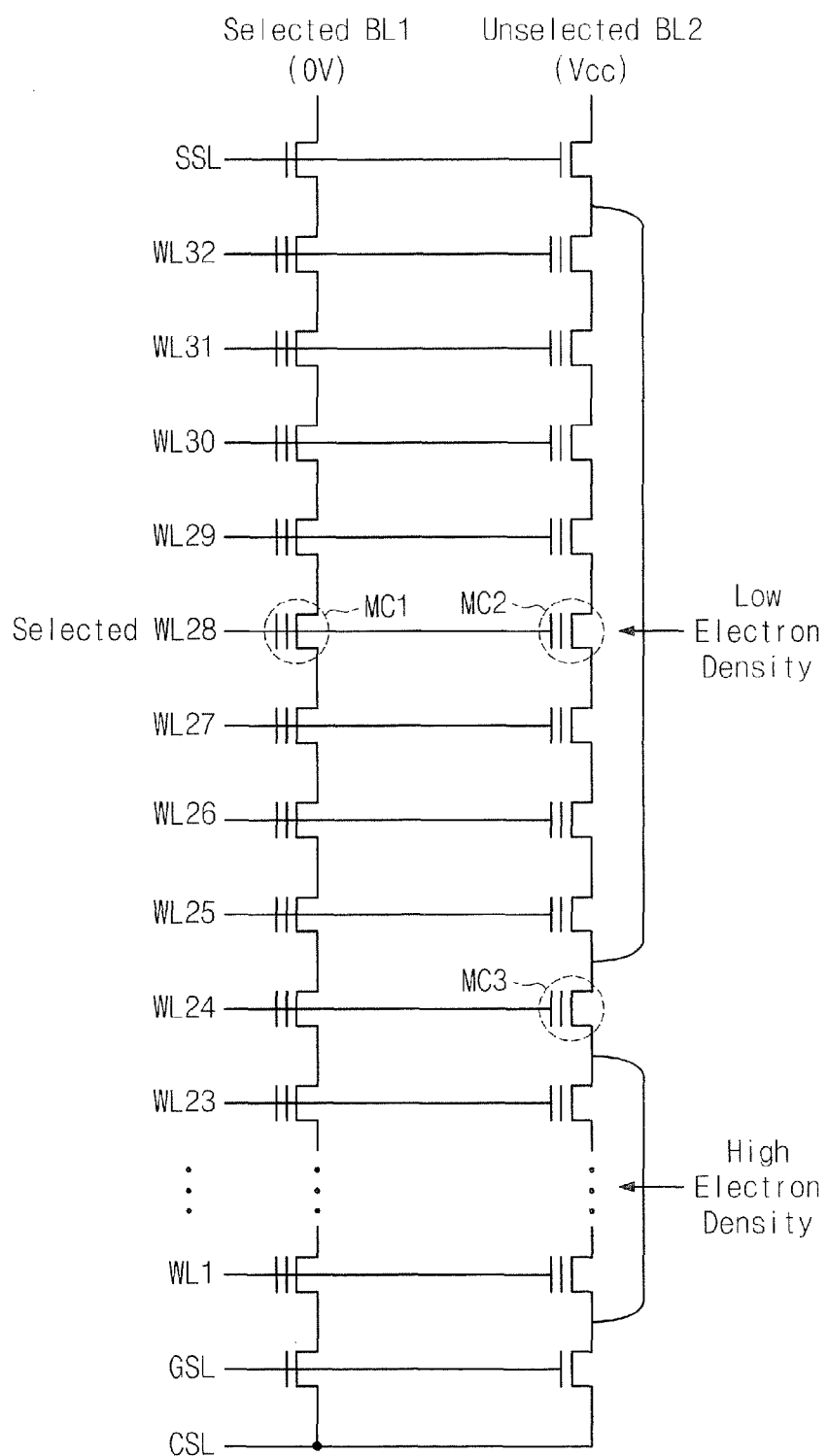
FIG. 25 is a diagram illustrating the channel isolation in a program method according to some embodiments.

Referring now to FIG. 25, a diagram illustrating the channel isolation in a program method according to some embodiments will be discussed. As illustrated in FIG. 25, as a transistor MC3 is turned off, a channel is isolated. Due to the electron transfer described with reference to FIG. 24, a channel corresponding to a selected word line has a low electron density while a channel not corresponding to the selected word line has a high electron density. Because the channel corresponding to the selected word line has a low electron density, the boosting efficiency of a channel voltage is improved. In the result, a program disturbance can be prevented by the boosting of the channel voltage.

In particular, the program disturbance may be more problematic in a multi-level cell to which a high program voltage is applied. The reason for this is that the range of the program voltage of a multi-level cell is wider than the range of the program voltage of a single-level cell. In the result, the program method according to some embodiments can have a great effect in a multi-level cell.

Figure 26:
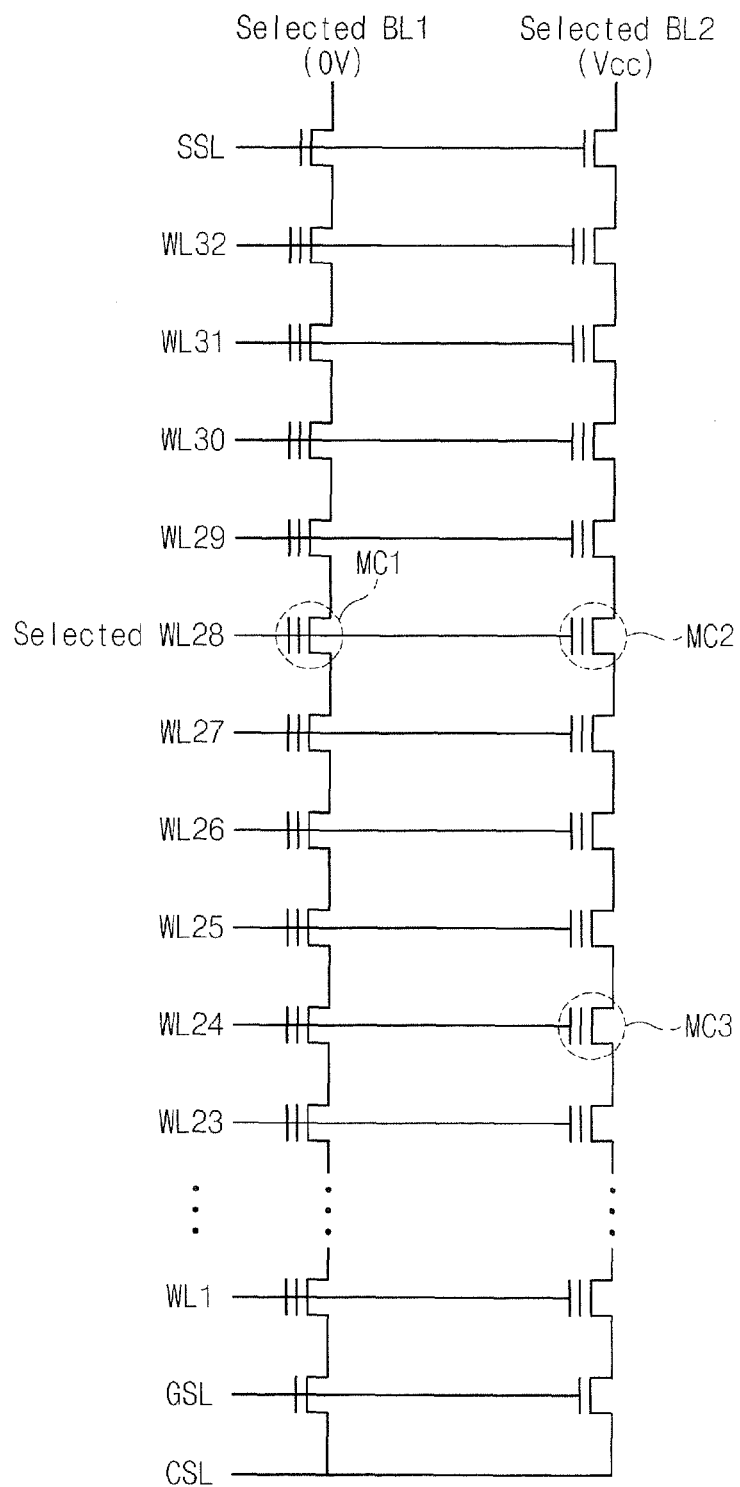
FIG. 26 is a diagram illustrating methods for programming a nonvolatile memory device according to some embodiments.

Referring now to FIG. 26, a diagram illustrating a method for programming a nonvolatile memory device according to some embodiments will be discussed. As illustrated in FIG. 26, it is assumed that a memory cell MC1 is programmed and a memory cell MC2 is not programmed. The memory cell MC1 is connected to a selected word line WL28 and a selected bit line BL1. The memory cell MC2 is connected to the selected word line WL28 and an unselected bit line BL2.

When the memory cell MC1 is programmed, the memory cell MC2 must not be programmed. In order not to program the memory cell MC2, a program inhibition voltage Vcc is applied to the unselected bit line BL2.

A local self-boosting scheme is applied in the inventive concept. In a program inhibition method according to some embodiments, a pass voltage Vpass is applied to the unselected word lines WL26 and WL27 adjacent to the selected word line WL28.

Also, a third local voltage and a second local voltage are applied respectively to the unselected word lines WL24 and WL25 adjacent to the unselected word lines WL26 and WL27. The level of the second local voltage is higher than the level of the third local voltage. For example, a voltage of about 4V may be applied to the word line WL25 and a voltage of about 2V may be applied to the word line WL24.

Under the above bias conditions, a transistor MC3 connected to the unselected word line WL24 is turned off by the third local voltage. Accordingly, a channel is isolated by the transistor MC3. According to the channel isolation, the boosting efficiency of a channel voltage is improved.

Also, the pass voltage is applied to the unselected word lines WL26 and WL27 and the second local voltage are applied to the unselected word line WL25, thereby preventing a sudden change in the channel voltage. That is, the selected word line WL28 and the word line WL25 are spaced, thereby preventing the problem caused by the sudden boosting of the channel voltage.

For example, if the channel voltage increases suddenly, the problem of BTBT (Band To Band Tunneling) may occur in the transistor MC3 isolating the channel. The BTBT must be avoided because it programs an unselected transistor. The bias conditions according to some embodiments will be described later in detail with reference to FIG. 27.

The inventive concept is not limited to the above bias conditions. For example, no or some word lines may be disposed between the selected word line WL28 and the word line WL25. Also in this case, the boosting efficiency can be improved by the channel isolation.

Figure 27:
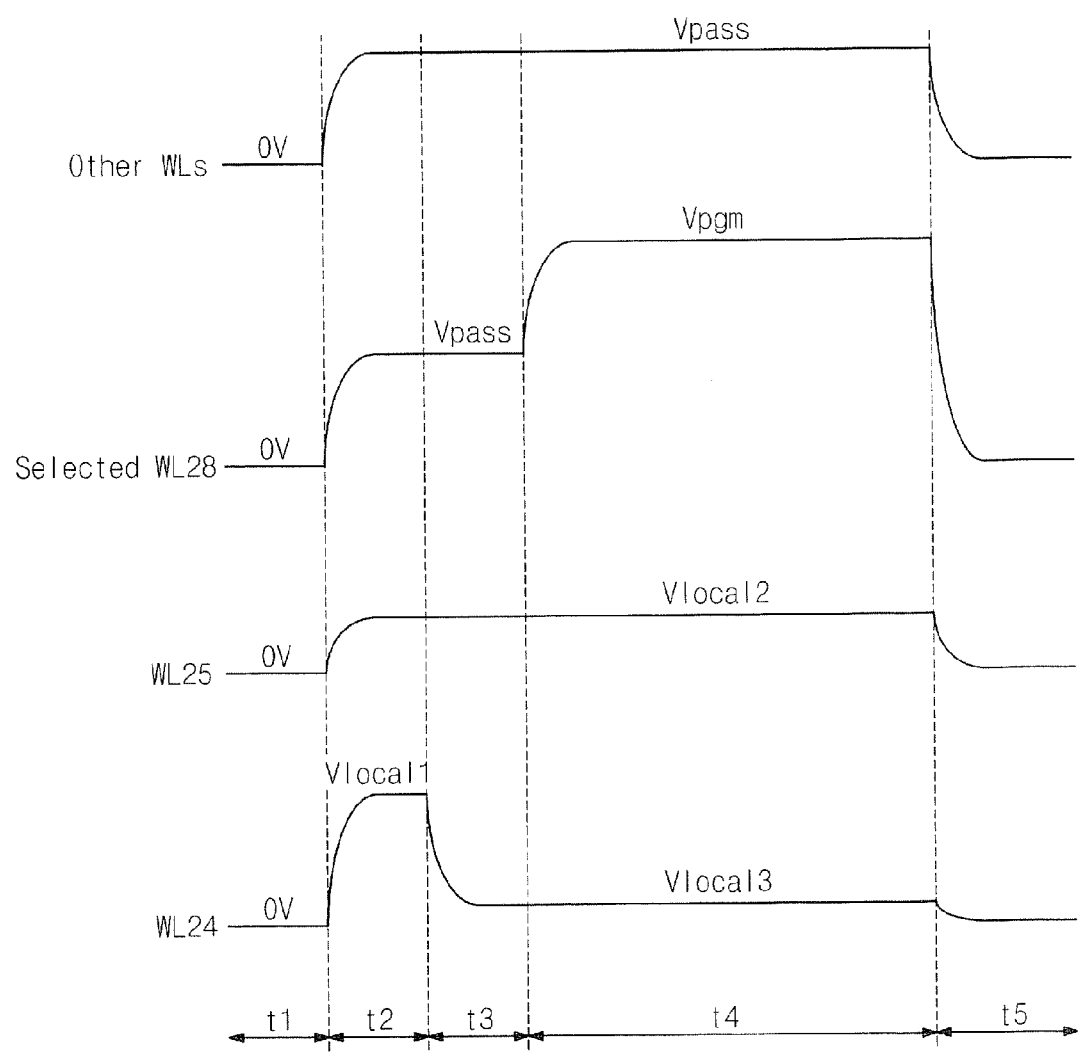
FIG. 27 is a timing diagram illustrating a voltage applying method in a program operation according to some embodiments.

Referring now to FIG. 27, a timing diagram illustrating a voltage applying method in a program operation according to some embodiments will be discussed. As illustrated in FIG. 27, a program operation according to some embodiments includes steps t1 to t5. In step t1, a ground voltage 0V is applied to word lines for initialization.

In step t2, the unselected word lines (Other WLs) and the selected word line WL28 are driven by a pass voltage Vpass. By application of the pass voltage Vpass, the unselected word lines (Other WLs) and the selected word line WL28 are turned on. A second local voltage Vlocal2 lower than the pass voltage Vpass is applied to the word line WL25.

A first local voltage Vlocal1 is applied to the word line WL24. As the word lines WL24 and WL25 are driven respectively by the first local voltage Vlocal1 and the second local voltage Vlocal2, electrons in a channel transfer. This will be described later in detail with reference to FIG. 28.

In step t3, a third local voltage Vlocal3 is applied to the word line WL24. By application of the third local voltage Vlocal3, a transistor connected to the word line WL24 is turned off. Accordingly, the channel is isolated.

In step t4, the selected word line WL28 is driven by a program voltage Vpgm. By application of the program voltage Vpgm, the channel voltage increases. Due to the increased channel voltage, an unselected memory cell MC2 is not programmed. In step t5, the respective word lines are driven by the ground voltage V0 for recovery.

Figure 28:
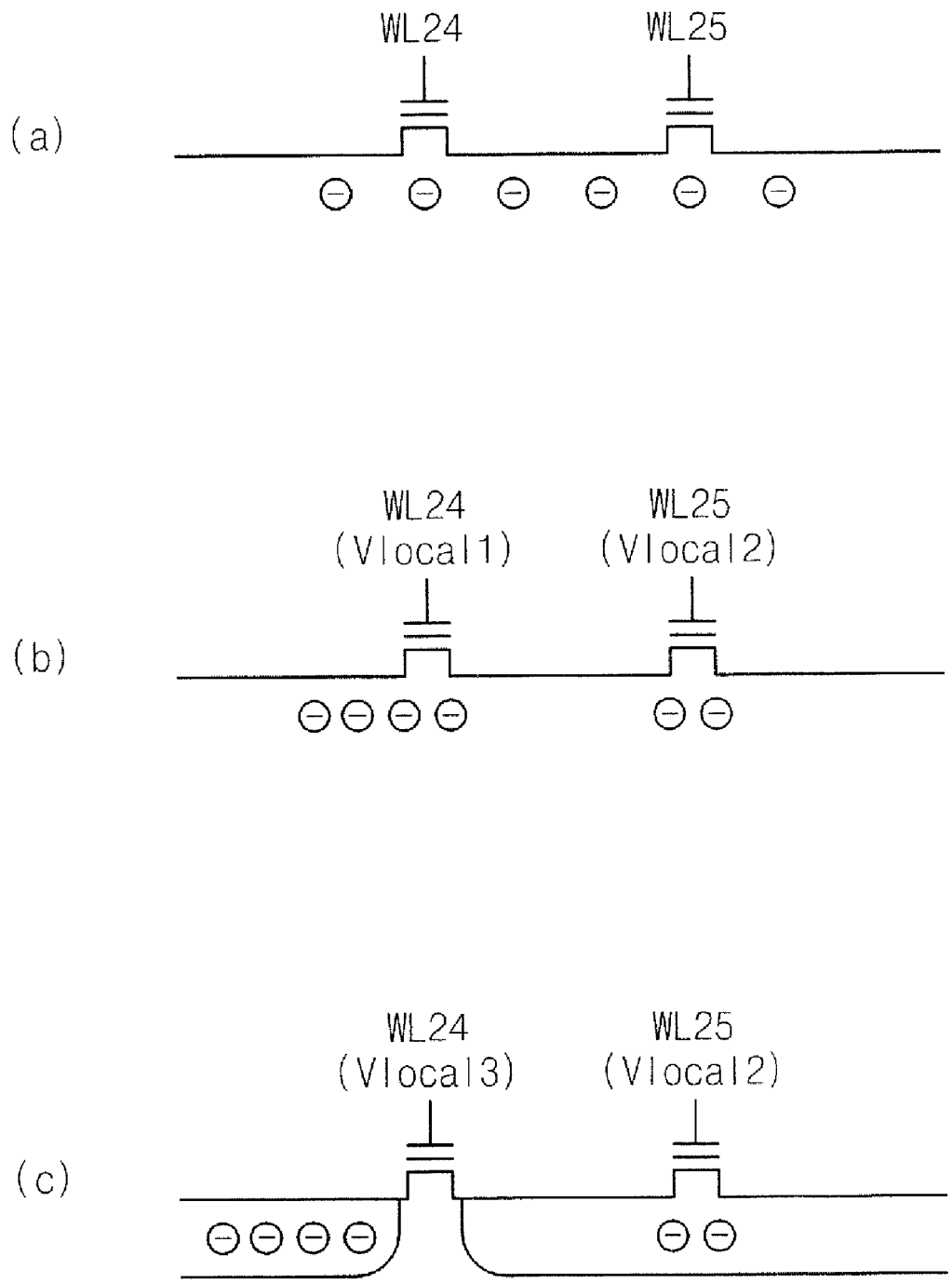
FIG. 28 is a diagram illustrating the electron distribution in a channel in periods t1 to t3 of FIG. 27.

Referring now to FIG. 28, a diagram illustrating the electron distribution in a channel in the periods t1 to t3 of FIG. 27 will be discussed. FIG. 28(a) illustrates the electron distribution in the channel in the period t1 of FIG. 27 (t=t1). Referring to FIG. 28(a), when no voltage is applied to the word lines WL24 and WL25, the electrons of the channel are distributed in a uniform density.

FIG. 28(b) illustrates the electron distribution in the channel in the period t2 of FIG. 27 (t=t2). Referring to FIG. 28(b), the relatively-high first local voltage Vlocal1 is applied to the word line WL24, and the relatively-low second local voltage Vlocal2 is applied to the word line WL25. Accordingly, the electrons transfer to the word line WL24. Thus, the channel of a transistor connected to the word line WL25 has a low electron density, and the channel of a transistor connected to the word line WL24 has a high electron density.

FIG. 28(c) illustrates the electron distribution in the channel in the period t3 of FIG. 27 (t=t3). Referring to FIG. 28(c), the third local voltage Vlocal3 is applied to the word line WL24 to turn off a transistor connected thereto. As the transistor is turned off, the channel is isolated. In the result, the electron density of the channel of the transistor connected to the word line WL25 decreases.

When the channel electron density decreases, the boosting efficiency of a channel voltage increases. In the inventive concept, the self-boosting efficiency is increased by decreasing the electron density of the channel corresponding to the selected word line.

Figure 29:
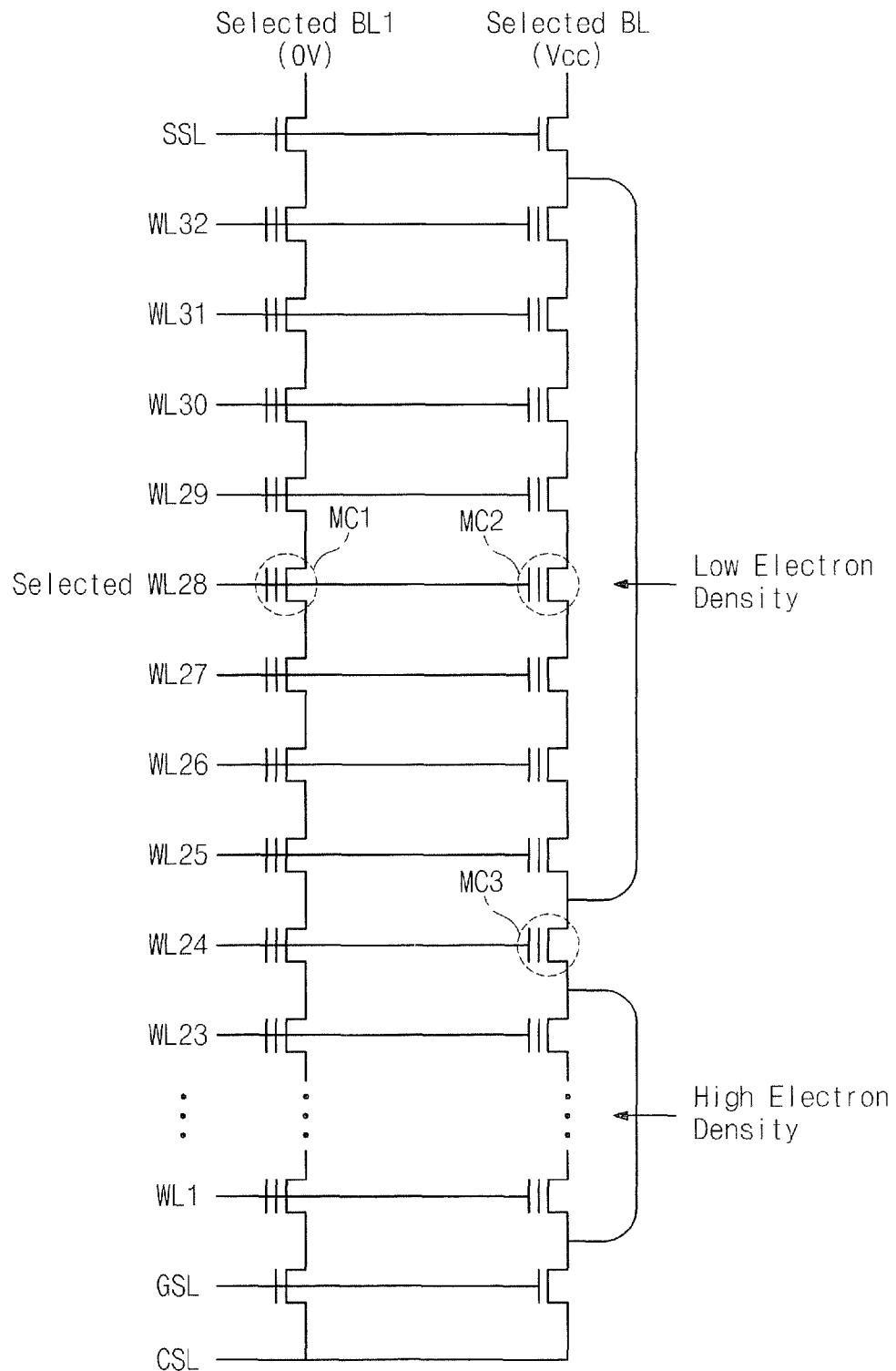
FIG. 29 is a diagram illustrating the channel isolation in a program method according to some embodiments.

Referring now to FIG. 29, a diagram illustrating the channel isolation in a program method according to some embodiments will be discussed. As illustrated in FIG. 29, as a transistor MC3 is turned off, a channel is isolated. Due to the electron transfer described with reference to FIG. 28, a channel corresponding to a selected word line has a low electron density while a channel not corresponding to the selected word line has a high electron density. Because the channel corresponding to the selected word line has a low electron density, the boosting efficiency of a channel voltage is improved. In the result, a program disturbance can be prevented by the boosting of the channel voltage.

Figure 30:
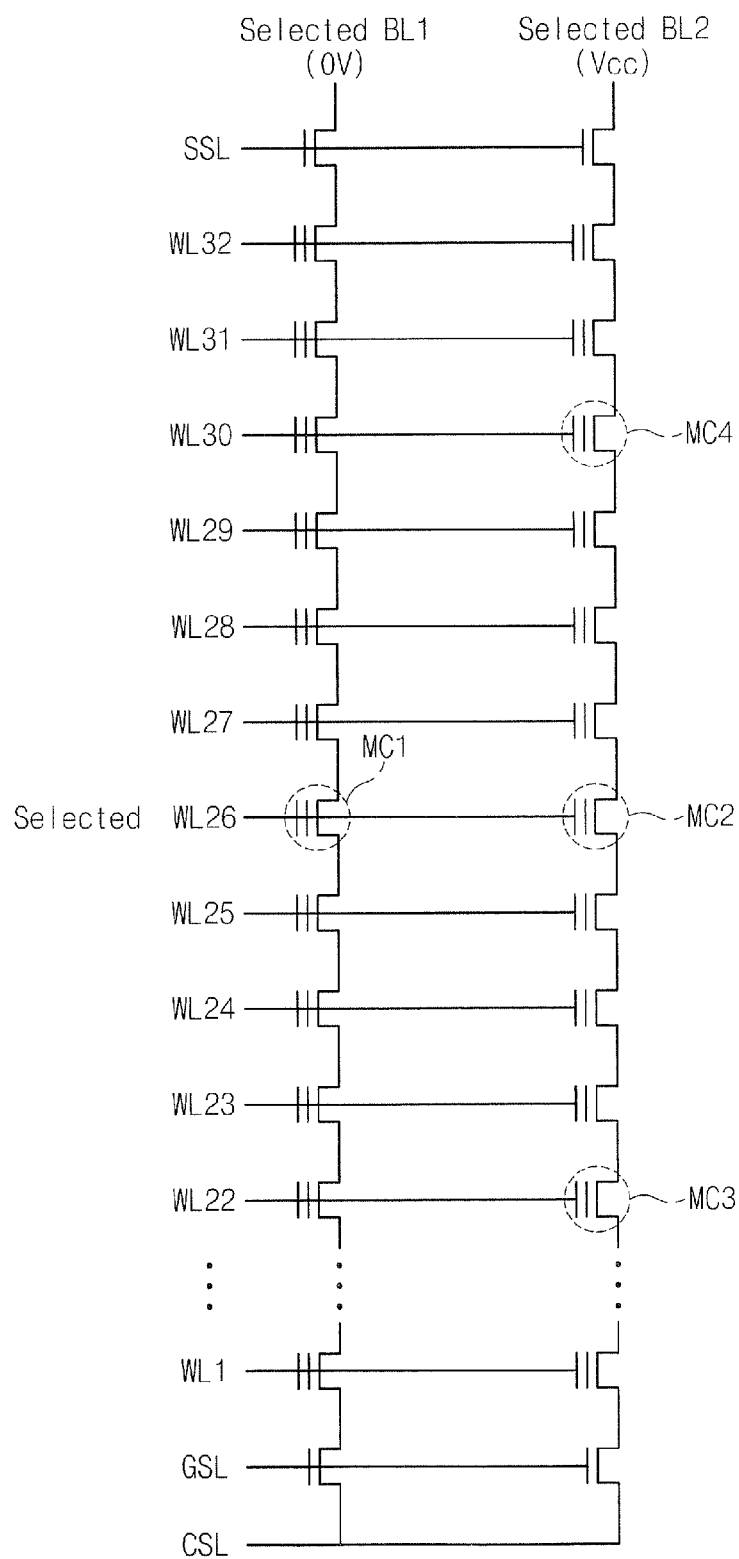
FIG. 30 is a diagram illustrating a method for programming a nonvolatile memory device according to some embodiments.

Referring now to FIG. 30, a diagram illustrating a method for programming a nonvolatile memory device according to some embodiments will be discussed. As illustrated in FIG. 30, it is assumed that a memory cell MC1 is programmed and a memory cell MC2 is not programmed. The memory cell MC1 is connected to a selected word line WL26 and a selected bit line BL1. The memory cell MC2 is connected to the selected word line WL26 and an unselected bit line BL2.

When the memory cell MC1 is programmed, the memory cell MC2 must not be programmed. In order not to program the memory cell MC2, a program inhibition voltage Vcc is applied to the unselected bit line BL2.

A local self-boosting scheme is applied in this embodiment. In a program inhibition method according to some embodiments, a pass voltage Vpass is applied to the unselected word lines WL24 and WL25 adjacent to the selected word line WL26. Also, a fifth local voltage Vlocal5 and a second local voltage Vlocal2 are applied respectively to the unselected word lines WL22 and WL23 adjacent to the unselected word lines WL24 and WL25. The level of the second local voltage Vlocal2 is higher than the level of the fifth local voltage Vlocal5. For example, a voltage of about 4V may be applied to the word line WL23 and a voltage of about 2V may be applied to the word line WL22.

Also, a pass voltage Vpass is applied to the unselected word lines WL27 and WL28 adjacent to the selected word line WL26. Also, a fourth local voltage Vlocal4 and a sixth local voltage Vlocal6 are applied respectively to the unselected word lines WL29 and WL30 adjacent to the unselected word lines WL27 and WL28. The level of the fourth local voltage Vlocal4 is higher than the level of the sixth local voltage Vlocal6. For example, a voltage of about 4V may be applied to the word line WL29 and a voltage of about 2V may be applied to the word line WL30.

Under the above bias conditions, a transistor MC3 connected to the unselected word line is turned off by the fifth local voltage Vlocal5. Accordingly, a channel is isolated by the transistor MC3. Also, a transistor MC4 connected to the unselected word line is turned off by the sixth local voltage Vlocal6. Accordingly, a channel is isolated by the transistor MC4.

In this embodiment, the pass voltage Vpass is applied to the unselected word lines and the second local voltage Vlocal2 and the fourth local voltage Vlocal4 are applied respectively to the unselected word lines WL23 and WL29, thereby preventing a sudden change in the channel voltage. That is, the selected word line WL26 and the word lines WL23 and WL29 are spaced, thereby preventing the problem caused by the sudden boosting of the channel voltage.

The inventive concept is not limited to the above bias conditions. For example, no or some word lines may be disposed between the selected word line WL26 and the word lines WL23 and WL29. Also in this case, the boosting efficiency can be improved by the channel isolation.

Figure 31:
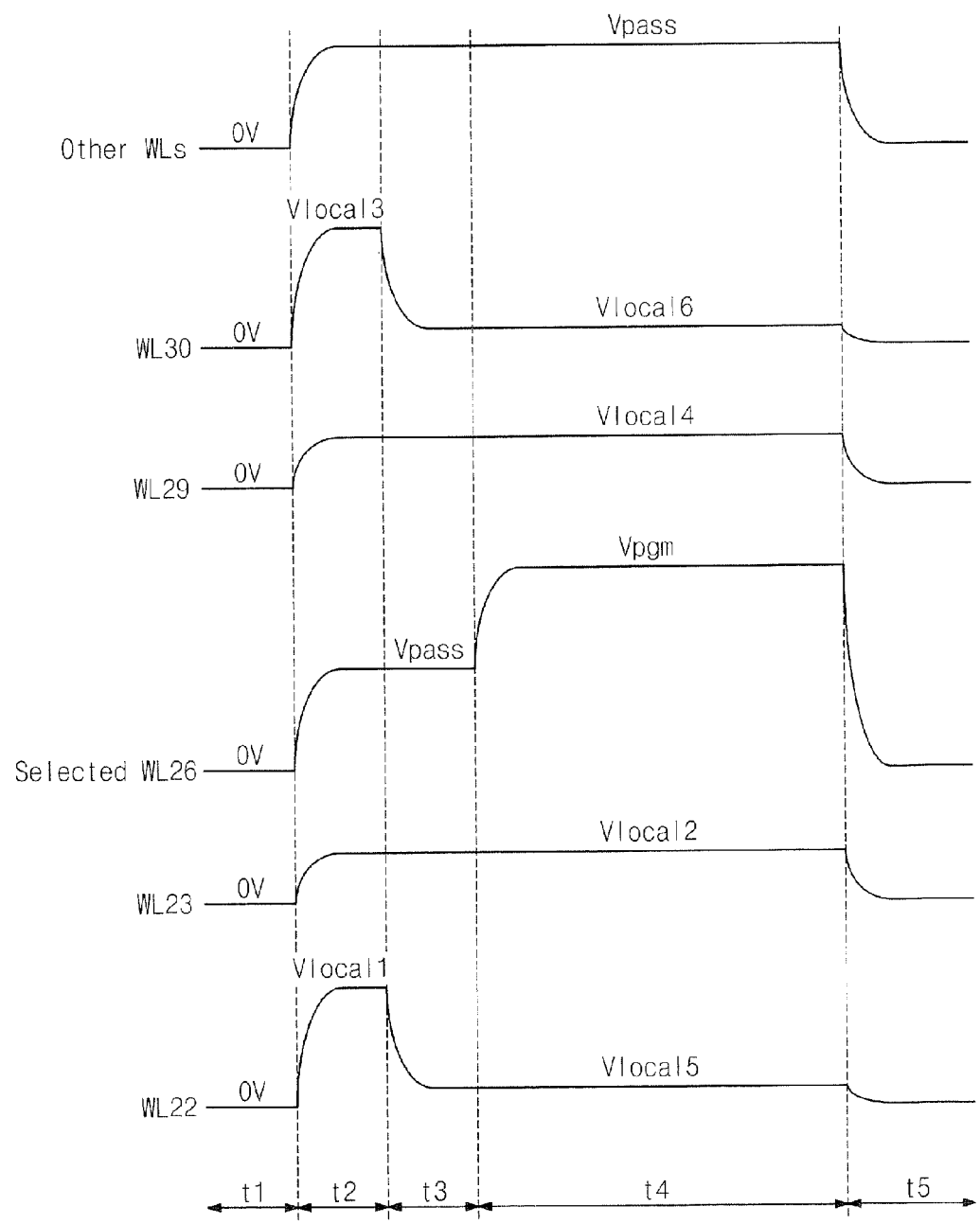
FIG. 31 is a timing diagram illustrating a voltage applying method in a program operation according to some embodiments.

Referring now to FIG. 31, a timing diagram illustrating a voltage applying method in a program operation according to some embodiments will be discussed. As illustrated in FIG. 31, a program operation according to some embodiments includes steps t1 to t5. In step t1, a ground voltage 0V is applied to word lines for initialization.

In step t2, the unselected word lines (Other WLs) and the selected word line WL26 are driven by a pass voltage Vpass. By application of the pass voltage Vpass, the unselected word lines (Other WLs) and the selected word line WL26 are turned on. A second local voltage Vlocal2 is applied to the word line WL23, and a fourth local voltage Vlocal4 is applied to the word line WL29.

A first local voltage Vlocal1 is applied to the word line WL22, and a third local voltage Vlocal3 is applied to the word line WL30. As the word lines WL22 and WL30 are driven respectively by the first local voltage Vlocal1 and the third local voltage Vlocal3, electrons in a channel transfer. This will be described later in detail with reference to FIG. 32.

In step t3, a fifth local voltage Vlocal5 is applied to the word line WL22, and a sixth local voltage Vlocal6 is applied to the word line WL30. By application of the fifth local voltage Vlocal5, a transistor connected to the word line WL22 is turned off. Also, by application of the sixth local voltage Vlocal6, a transistor connected to the word line WL30 is turned off. Accordingly, the channel is isolated.

In step t4, the selected word line WL26 is driven by a program voltage Vpgm. By application of the program voltage Vpgm, the channel voltage increases. Due to the increased channel voltage, an unselected memory cell MC3 is not programmed. In step t5, the respective word lines are driven by the ground voltage V0 for recovery.

Figure 32:
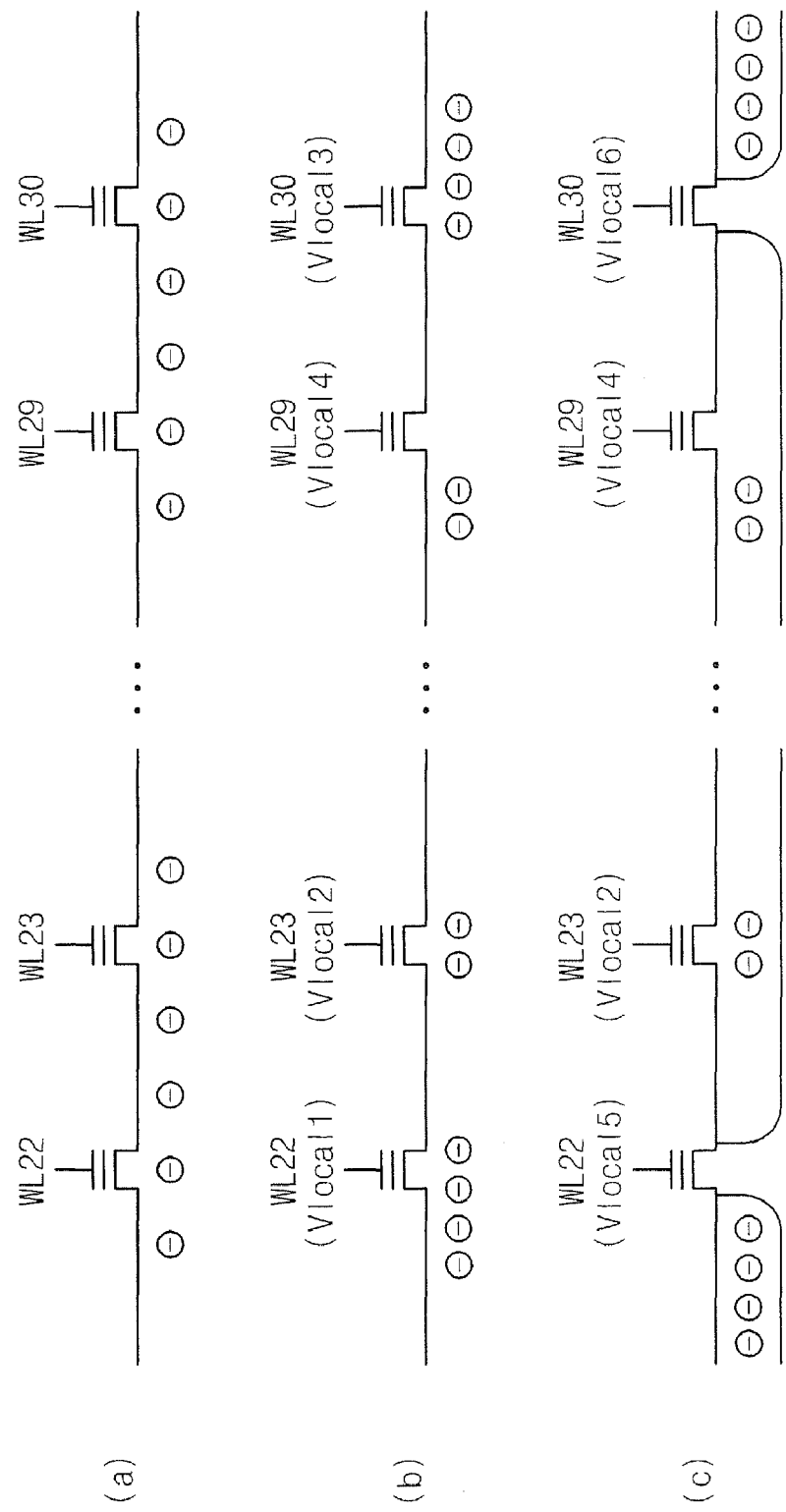
FIG. 32 is a diagram illustrating the electron distribution in a channel in periods t1 to t3 of FIG. 31.

Referring now to FIG. 32, is a diagram illustrating the electron distribution in a channel in the periods t1 to t3 of FIG. 31 will be discussed. FIG. 32(a) illustrates the electron distribution in the channel in the period t1 of FIG. 31 (t=t1). Referring to FIG. 32(a), when no voltage is applied to the word lines WL22, WL23, WL29 and WL30, the electrons of the channel are distributed in a uniform density.

FIG. 32(b) illustrates the electron distribution in the channel in the period t2 of FIG. 31 (t=t2). Referring to FIG. 32(b), the relatively-high first and third local voltage Vlocal1 and Vlocal3 are applied respectively to the word lines WL22 and WL30.

Also, the relatively-low second local voltage Vlocal2 is applied to the word line WL23. Also, the relatively-low fourth local voltage Vlocal4 is applied to the word line WL29. Accordingly, the electrons transfer to the word line WL30. Thus, the channel of transistors connected to the word lines WL23 and WL29 has a low electron density, and the channel of transistors connected to the word lines WL22 and WL30 has a high electron density.

FIG. 32(c) illustrates the electron distribution in the channel in the period t3 of FIG. 31 (t=t3). Referring to FIG. 32(c), the fifth local voltage Vlocal5 is applied to turn off a transistor connected the word line WL22. As the transistor is turned off, the channel is isolated. In the result, the electron density of the channel of the transistor connected to the word line WL22 decreases. Also, the sixth local voltage Vlocal6 is applied to turn off a transistor connected the word line WL30. As the transistor is turned off, the channel is isolated. In the result, the electron density of the channel of the transistor connected to the word line WL30 decreases.

When the channel electron density decreases, the boosting efficiency of a channel voltage increases. In the inventive concept, the self-boosting efficiency is increased by decreasing the electron density of the channel corresponding to the selected word line.

Figure 33:
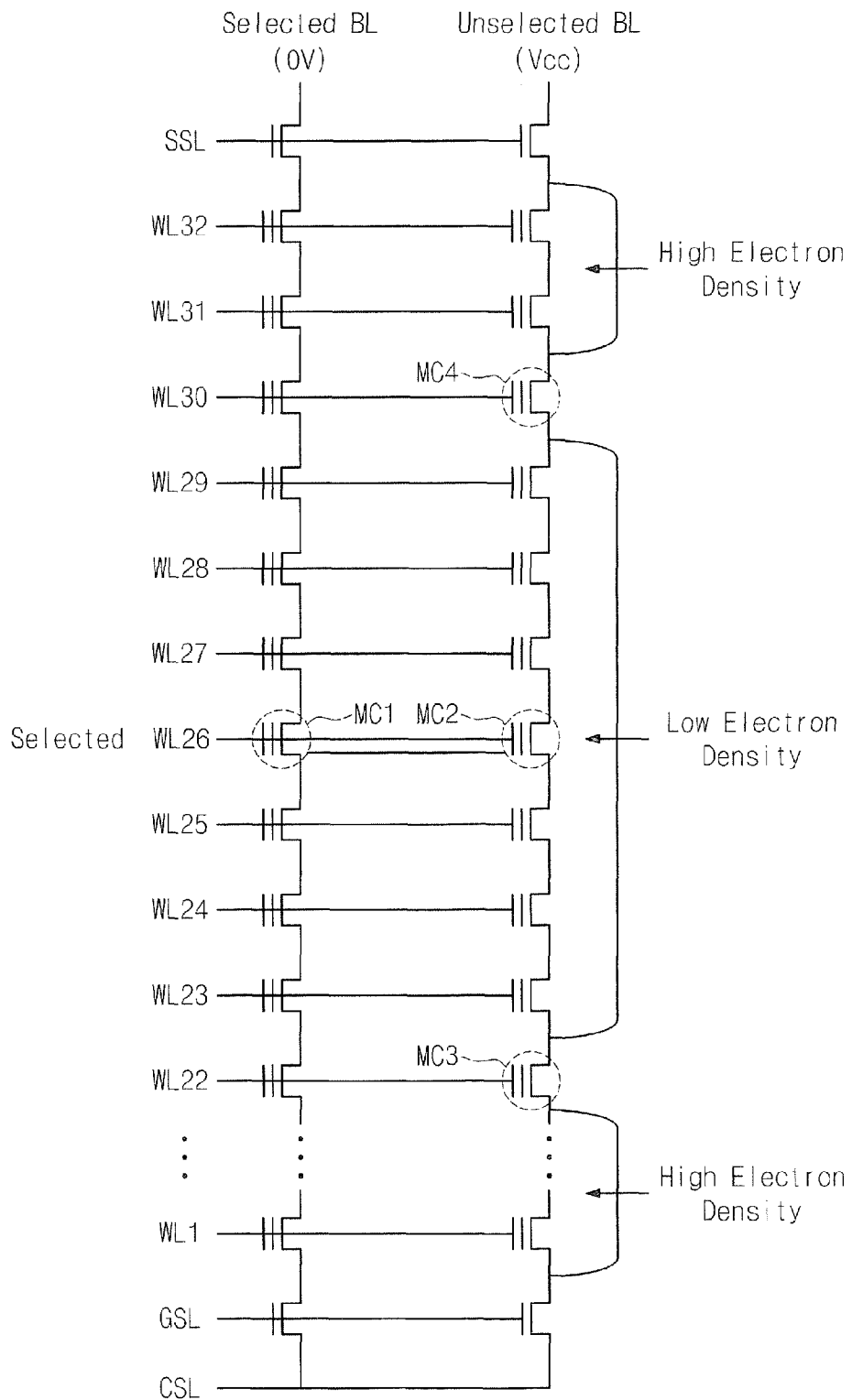
FIG. 33 is a diagram illustrating the channel isolation in a program method according to some embodiments.

Referring now to FIG. 33, a diagram illustrating the channel isolation in a program method according to some embodiments will be discussed. As illustrated in FIG. 33, as transistors MC3 and MC4 are turned off, a channel is isolated. Due to the electron transfer described with reference to FIG. 32, a channel including the selected word line WL26 has a low electron density while a channel not including the selected word line WL26 has a high electron density. Because the channel including the selected word line WL26 has a low electron density, the boosting efficiency is improved.

Figure 34:
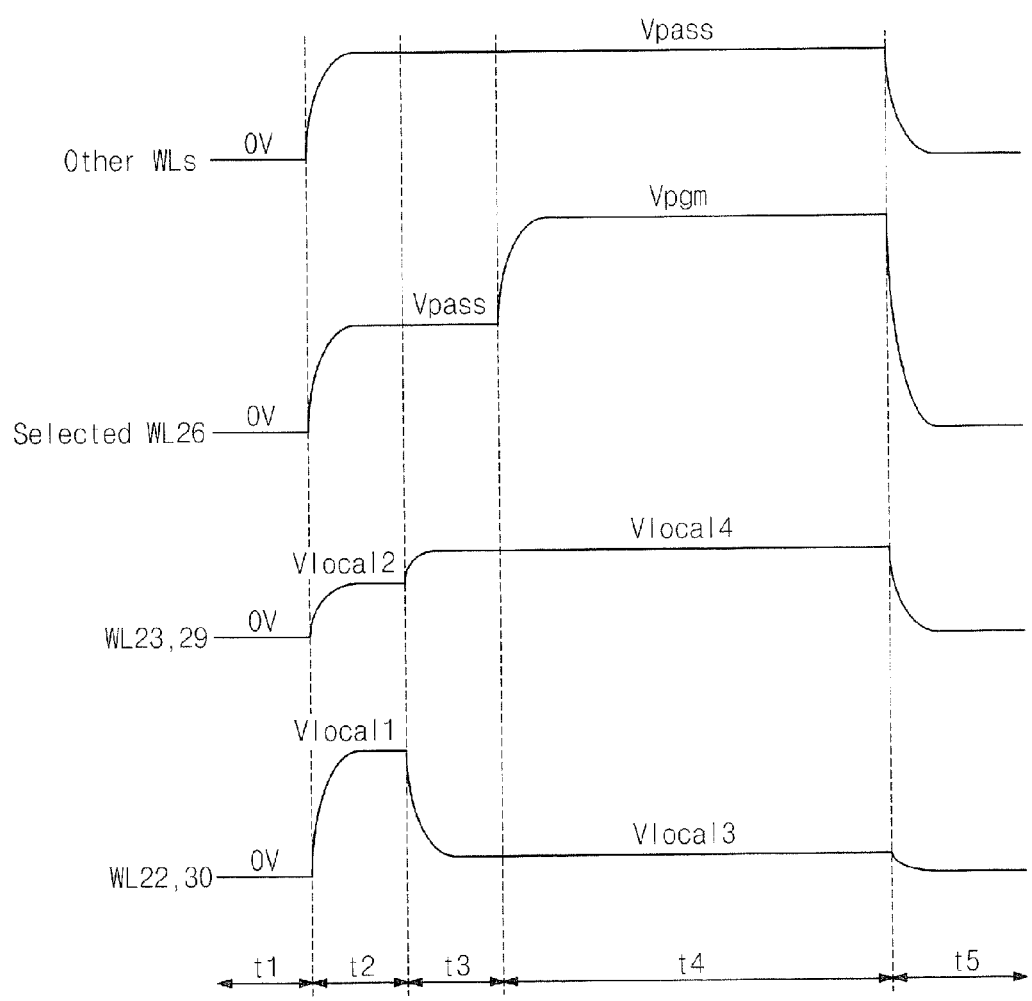
FIG. 34 is a timing diagram illustrating a voltage applying method in a program operation according to some embodiments.

Referring now to FIG. 34, a timing diagram illustrating a voltage applying method in a program operation according to some embodiments will be discussed. As illustrated in FIG. 34, a program operation according to some embodiments includes steps t1 to t5. In step t1, a ground voltage 0V is applied to word lines for initialization.

In step t2, the unselected word lines (Other WLs) and the selected word line WL26 are driven by a pass voltage Vpass. By application of the pass voltage Vpass, the unselected word lines (Other WLs) and the selected word line WL26 are turned on. A second local voltage Vlocal2 is applied to the word line WL23 and WL29.

A first local voltage Vlocal1 higher than the second local voltage Vlocal2 is applied to the word line WL22 and WL30. As the word lines WL22 and WL30 are driven by the first local voltage Vlocal1 and the word lines WL23 and WL29 are driven by the second local voltage Vlocal2, electrons in a channel transfer.

In step t3, a third local voltage Vlocal3 is applied to the word line WL22 and WL30. By application of the third local voltage Vlocal3, a transistor connected to the word line WL22 and WL30 is turned off. Accordingly, a channel is isolated. A fourth local voltage Vlocal4 higher than the second local voltage Vlocal2 is applied to the word line WL23 and WL29. By application of the fourth local voltage Vlocal4, the boosting efficiency of the channel is improved.

In step t4, the selected word line WL26 is driven by a program voltage Vpgm. By application of the program voltage Vpgm, the channel voltage increases. Due to the increased channel voltage, an unselected memory cell MC2 is not programmed. In step t5, the respective word lines are driven by the ground voltage 0V for recovery.

Figure 35:
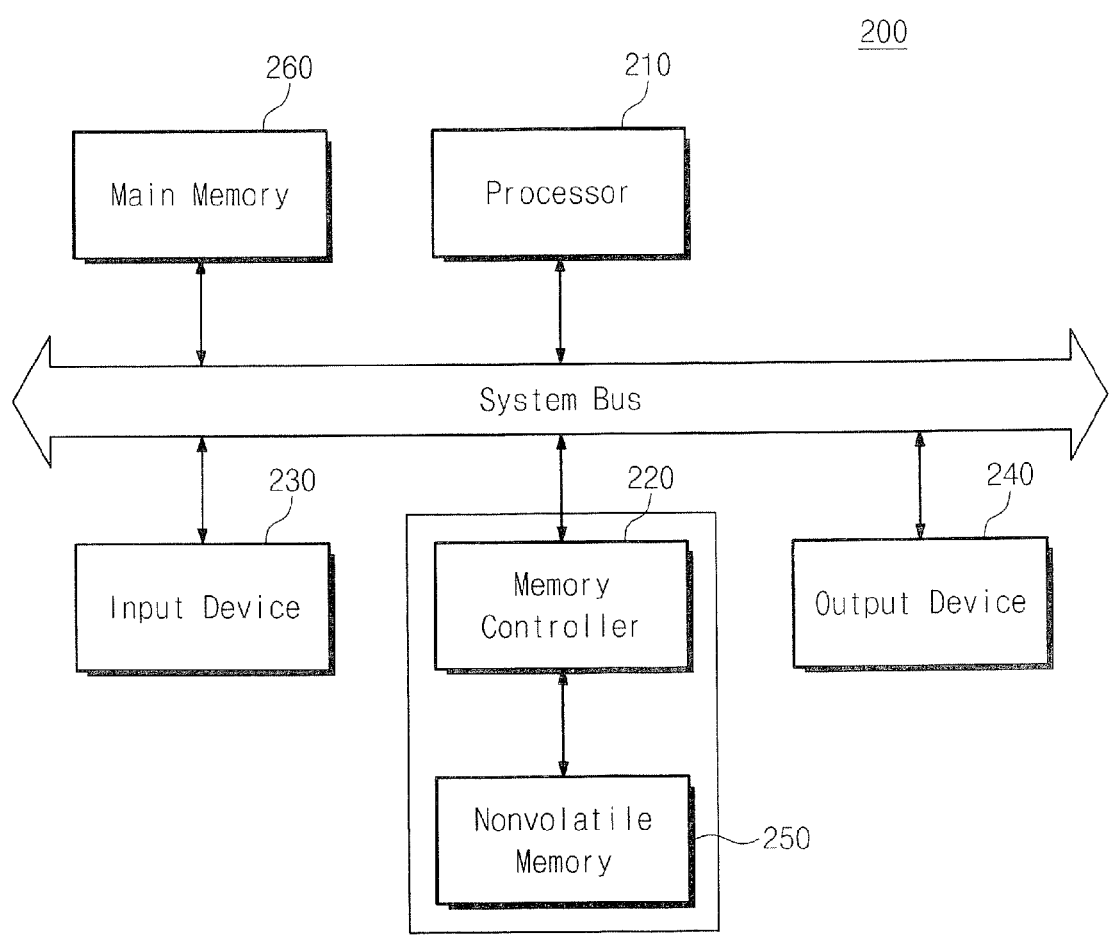
FIG. 35 is a block diagram of a computing system including a nonvolatile memory device according to some embodiments.

Referring now to FIG. 35, a block diagram of a computing system 200 including a nonvolatile memory device according to some embodiments will be discussed. As illustrated in FIG. 35, the computing system 200 includes a processor 210, a memory controller 220, input devices 230, output devices 240, a nonvolatile memory device 250, and a main memory device 260. In FIG. 35, a solid line denotes a system bus for transferring data or commands.

The memory controller 220 and the nonvolatile memory device 250 may constitute a memory card. Also, the processor 210, the input devices 230, the output devices 240, and the main memory device 260 may constitute a host that uses a memory card as a memory device.

The computing system 200 receives data from an external device through the input devices 230 (e.g., a keyboard and a camera). The received data may be commands by users or may be multimedia data such as image data by cameras. The received data is stored in the nonvolatile memory device 250 or the main memory device 260.

The process results of the processor 210 are stored in the nonvolatile memory device 250 or the main memory device 260. The output devices 240 output the data stored in the nonvolatile memory device 250 or the main memory device 260. The output devices 240 output digital data in the format sensible by the humans. For example, the output devices 240 include a display or a speaker. The program method according to some embodiments may be applied to the nonvolatile memory device 250. As the reliability of the nonvolatile memory device 250 increases, the reliability of the computing system 200 also increases.

The flash memory device 250 and/or the memory controller 220 may be mounted in various types of packages. Examples of the packages of the flash memory device 250 and/or the memory controller 220 include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), Thin Quad Flat Pack (TQFP), System In Package (SIP), Multi Chip Package (MCP), Wafer-level Fabricated Package (WFP), and Wafer-level Processed Stack Package (WSP).

Although not illustrated in FIG. 35, it will be apparent to those skilled in the art that a power supply unit is further provided to supply the power necessary to operate the computing system 200. Also, if the computing system 200 is a mobile device, a battery is further provided to supply the power necessary to operate the computing system 200.

Figure 36:
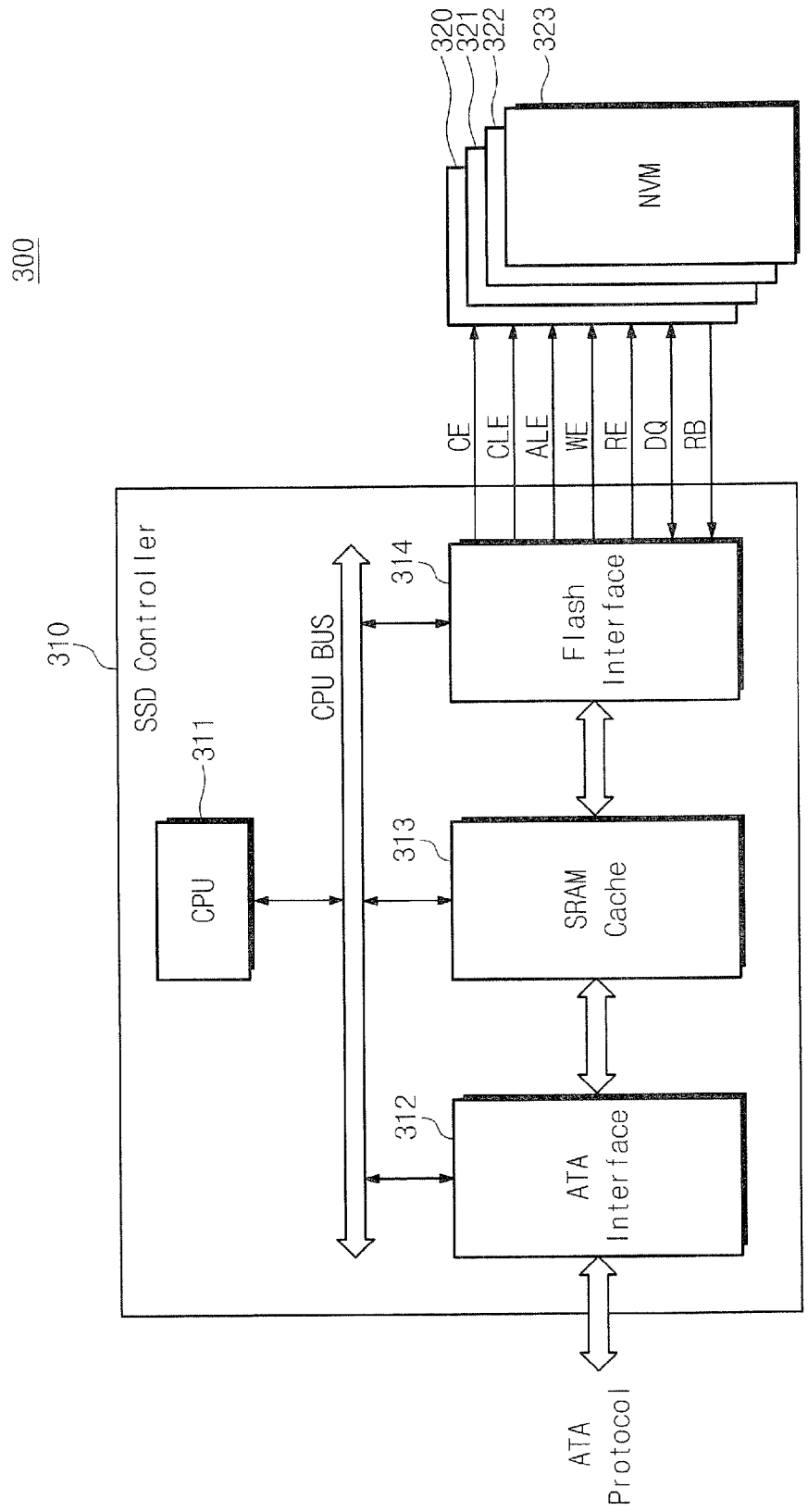
FIG. 36 is a block diagram of an SSD system including a nonvolatile memory device according to some embodiments.

Referring now to FIG. 36, a block diagram of a solid state drive (SSD) system 300 including a nonvolatile memory device according to some embodiments will be discussed. As illustrated in FIG. 36, the SSD system 300 includes an SSD controller 310 and nonvolatile memory (NVM) devices 320 to 323.

The nonvolatile memory device according to some embodiments is also applicable to SSD products. SSD products, which are expected to replace hard disk drives (HDDs), are being esteemed in the next-generation memory market. SSDs are data storage devices that store data by using memory chips such as flash memories, instead of rotatable disks used in HDDs. In comparison with HDDs operating mechanically, SSDs are high in speed, robust against external impacts, and low in power consumption.

Referring back to FIG. 36, a central processing unit (CPU) 311 receives a command from a host, and determines/controls whether to store data from the host in the nonvolatile memory device or to read data from the nonvolatile memory device and transmit the same to the host.

Under the control of the CPU 311, an ATA interface 312 exchanges data with the host. The ATA interface 312 patches commands or addresses from the host and transfers the same to the CPU 311 through a CPU bus. Data, which will be received/transmitted from/to the host through the ATA interface 312, are transferred through an SRAM cache 313 without passing through the CPU bus, under the control of the CPU 311. The ATA interface 312 includes the S-ATA (serial ATA) standard and the P-ATA (parallel ATA) standard.

The SRAM cache 313 temporarily stores data exchanged between the host and the nonvolatile memory devices 320 to 323. The SRAM cache 313 is also used to store programs that will be executed by the CPU 311. The SRAM cache 313 may be regarded as a kind of buffer memory. The SRAM cache 313 may be implemented by other types of memories. A flash interface 314 exchanges data with the nonvolatile memory devices that are used as storage devices. The flash interface 314 may be configured to support NAND flash memories, One-NAND flash memories, or multi-level flash memories.

Semiconductor memory systems according to some embodiments may be used as portable storage devices. Thus, the semiconductor memory systems according to some embodiments may be used as storage devices for MP3 players, digital cameras, PDAs, or e-Book. The semiconductor memory systems according to some embodiments may also be used as storage devices for digital TVs or computers.

As described above, the inventive concept can increase the self-boosting efficiency in a program operation, thus making it possible to prevent an unselected memory cell from being programmed.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A method for programming a nonvolatile memory device, the memory device including a local word line diving a memory cell string into a first area including a selected word line and a second area not including the selected word line, the method comprising:
    driving word lines of the first area by a first pass voltage;
    driving word lines of the second area by a second pass voltage, higher than the first pass voltage;
    turning off a cell transistor corresponding to the local word line after applying the first pass voltage and the second pass voltage; and
    driving the selected word line by a program voltage after turning off the cell transistor.

2. The method of claim 1, wherein turning off the cell transistor is followed by driving the selected word line or an unselected word line of the first area by the second pass voltage.

3. The method of claim 1, further comprising applying a local voltage, which is higher than a ground voltage and lower than the first pass voltage, to the local word line to turn off the cell transistor.

4. The method of claim 1, further comprising driving an unselected word line of the first area by a voltage lower than the first pass voltage after driving the word lines of the first area by the first pass voltage.

5. A method for programming a nonvolatile memory device, the memory device including a first local word line to divide a memory cell string into a first area including a selected word line and a second area not including the selected word line, the method comprising:
    driving word lines of the first area by a first pass voltage;
    driving word lines of the second area by a second pass voltage, higher than the first pass voltage;
    driving a second local word line, which is included in the first area and adjacent to the first local word line, and the first local word line respectively by a first local voltage and a second local voltage after applying the first pass voltage and the second pass voltage; and
    driving the selected word line by a program voltage after applying the first local voltage and the second local voltage.

6. The method of claim 5, wherein applying the first local voltage and the second local voltage is followed by driving the selected word line or an unselected word line of the first area by the second pass voltage.

7. The method of claim 5, further comprising turning off a cell transistor corresponding to the first local word line by applying the second local voltage, wherein the second local voltage is higher than a ground voltage and lower than the first local voltage.

8. The method of claim 5, wherein driving the word lines of the first area by the first pass voltage is followed by driving an unselected word line of the first area by a voltage lower than the first pass voltage.

9. A method for programming a nonvolatile memory device, comprising:
    driving a first word line by a first local voltage;
    driving a second word line between the first word line and a selected word line by a second local voltage lower than the first local voltage; and
    driving the first word line by a third local voltage lower than the second local voltage after driving the second word line by the second local voltage.

10. The method of claim 9, wherein driving the first word line by the third local voltage is followed by driving the selected word line by a program voltage.

11. The method of claim 9, further comprising turning off a cell transistor connected to the first word line by applying the third local voltage.

12. The method of claim 9, wherein driving the selected word line by a program voltage is preceded by driving one or more unselected word lines between the second word line and the selected word line by a pass voltage higher than the second local voltage.

13. The method of claim 9, wherein driving the second word line by the second local voltage is followed by driving the second word line by a fourth local voltage higher than the second local voltage.

14. A method for programming a nonvolatile memory device, comprising:
   driving a first word line by a first local voltage;
   driving a second word line between the first word line and a selected word line by a second local voltage, lower than the first local voltage;
   driving a third word line by a third local voltage;
   driving a fourth word line between the third word line and a selected word line by a fourth local voltage lower than the third local voltage;
   driving the first word line by a fifth local voltage lower than the second local voltage after driving the second word line by the second local voltage;
   driving the third word line by a sixth local voltage lower than the fourth local voltage after driving the fourth word line by the fourth local voltage; and
   driving the selected word line by a program voltage after driving the first/third word line by the fifth/sixth local voltage,
   wherein the selected word line is disposed between the second word line and the fourth word line.

15. The method of claim 14, further comprising:
   turning off a cell transistor connected to the first word line by applying the fifth local voltage; and
   turning off a cell transistor connected to the third word line by applying the sixth local voltage.

16. The method of claim 14, wherein driving the selected word line by a program voltage is preceded by:
   driving one or more unselected word lines between the second word line and the selected word line by a pass voltage higher than the second local voltage or driving one or more unselected word lines between the fourth word line and the selected word line by the pass voltage higher than the fourth local voltage.

* * * * *